(12) United States Patent
Mikuni et al.

(10) Patent No.: US 8,365,130 B2
(45) Date of Patent: Jan. 29, 2013

(54) COMPUTER PROGRAM AND METHOD FOR GENERATING WIRE ROUTING PATTERN

(75) Inventors: Katsushi Mikuni, Musashino (JP); Toshiyuki Kudo, Musashino (JP); Masatoshi Yokouchi, Musashino (JP); Issei Sakurada, Musashino (JP); Tatsuo Inoue, Musashino (JP)

(73) Assignee: Micronics Japan Co., Ltd., Musashino-shi (JP)

( * ) Notice: Subject to any disclaimer, the term of this patent is extended or adjusted under 35 U.S.C. 154(b) by 0 days.

(21) Appl. No.: 13/338,875

(22) Filed: Dec. 28, 2011

(65) Prior Publication Data

US 2012/0167032 A1 Jun. 28, 2012

(30) Foreign Application Priority Data

Dec. 28, 2010 (JP) .................................. 2010-293124

(51) Int. Cl.
  *G06F 17/50* (2006.01)

(52) U.S. Cl. ......... 716/126; 716/129; 716/130; 716/132

(58) Field of Classification Search .................. 716/126, 716/129–130, 132
See application file for complete search history.

(56) References Cited

U.S. PATENT DOCUMENTS

| | | | | |
|---|---|---|---|---|
| 6,295,634 B1 * | 9/2001 | Matsumoto | ................... | 716/126 |
| 7,107,564 B1 * | 9/2006 | Teig et al. | ...................... | 716/129 |
| 7,571,411 B2 * | 8/2009 | Hentschke et al. | ........... | 716/126 |
| 7,725,863 B2 * | 5/2010 | Mayer | .......................... | 716/129 |
| 7,859,537 B2 * | 12/2010 | Hsu | ................................. | 345/441 |
| 8,095,904 B2 * | 1/2012 | Hentschke et al. | ........... | 716/126 |
| 2005/0229137 A1 * | 10/2005 | Ito | ................................... | 716/12 |

FOREIGN PATENT DOCUMENTS

| | | |
|---|---|---|
| JP | 62-039024 A | 2/1987 |
| JP | 11-167564 A | 6/1999 |
| JP | 2005-275780 A | 10/2005 |

* cited by examiner

*Primary Examiner* — Nghia Doan
(74) *Attorney, Agent, or Firm* — Holtz, Holtz, Goodman & Chick, PC

(57) ABSTRACT

A computer program generates a wire routing pattern that connects one driver with a plurality of receivers. The overlapping length of each vector pair, which consists of any two vectors headed from the driver to the receivers, is calculated. One vector pair that has the greatest overlapping length is selected. For the selected vector pair, three kinds of common nodes are created, each of which is used to make a common path part of the way to the receivers, to generate three kinds of renewed vector patterns. The operations are repeated and plural candidate routing patters are acquired. One candidate routing pattern having the smallest total wiring length is selected as the optimum routing pattern. If there exist plural patterns that have the same smallest total wiring length, one pattern can be selected that has the smallest one of the greatest. D-R path lengths.

2 Claims, 16 Drawing Sheets

CREATION OF OVERLAPPING VECTOR

FIRST COMMON NODE LOCATED ON ENDPOINT OF
OVERLAPPING VECTOR

SECOND COMMON NODE LOCATED ON ENDPOINT OF
SHORTER VECTOR

THIRD COMMON NODE LOCATED ON ENDPOINT OF
LONGER VECTOR

FIRST ARRANGEMENT OF TERMINALS

INITIAL STATE

TREE STRUCTURE

CONDITION 1

CONDITION 2

CONDITION 3

TL=18, PL=12

CONDITION 1-1 (CANDIDATE)

TL=21, PL=18

CONDITION 1-2 (CANDIDATE)

TL=22, PL=15

CONDITION 1-3 (CANDIDATE)

TL=18, PL=18

CONDITION 2-1 (CANDIDATE)

TL=18, PL=18

CONDITION 2-2 (CANDIDATE)

TL=22, PL=18

CONDITION 2-3 (CANDIDATE)

TL=22, PL=19

CONDITION 3-1 (CANDIDATE)

TL=25, PL=25

CONDITION 3-2 (CANDIDATE)

TL=30, PL=23

CONDITION 3-3 (CANDIDATE)

CONDITION 1-1 (CANDIDATE)

ACQUIRE AS OPTIMUM ROUTING PATTERN

CONDITION 2-1 (CANDIDATE)

SAME TOTAL WIRING LENGTH TL AND DIFFERENT GREATEST D-R PATH LENGTHS PL

SECOND ARRANGEMENT OF TERMINALS

OPTIMUM ROUTING PATTERN OBTAINED BY
MAXIMIZED OVERLAPPING COST METHOD

OPTIMUM ROUTING PATTERN OBTAINED BY
APPROXIMATE SOLUTION OF MINIMUM STEINER TREE

OPTIMUM ROUTING PATTERN OBTAINED BY
PROGRAM ACCORDING TO PRESENT INVENTION

THIRD ARRANGEMENT OF TERMINALS

WHEN THIRD COMMON
NODE IS NOT CONSIDERED

WHEN THIRD COMMON
NODE IS CONSIDERED

TL=13, PL=9

TL=12, PL=10

OPTIMUM ROUTING
PATTERN

OPTIMUM ROUTING
PATTERN

FOURTH ARRANGEMENT OF TERMINALS

OPTIMUM ROUTING PATTERN

COMPUTER PROGRAM AND METHOD FOR GENERATING WIRE ROUTING PATTERN

BACKGROUND OF THE INVENTION

The present invention relates to a computer program and a method for generating a wire routing pattern, which includes wiring paths between one signal-source terminal, which is referred to as a driver hereinafter, and a plurality of signal-receiving terminals, each of which is referred to as a receiver hereinafter.

In the field of the wiring board or the like, when generating wiring paths between one driver and plural receivers, there is a demand for making the total wiring length smallest possible. On the other hand, there is another demand for making the length of each wiring path headed from the driver to each receiver smallest possible. If the total wiring length is reduced, the stray capacitance of the whole wiring path is reduced to restrain signal deterioration. If the length of a wiring path headed from the driver to the receiver is reduced, the deterioration of a specific signal headed from the driver to the receiver is restrained.

In the field of the interconnection among many terminals, there is known the solution of the minimum Steiner tree, which is one method for generating a wire routing pattern having the smallest total wiring length. In general, if there are many terminals and all possible wiring paths must be considered, a huge amount of calculation is required for generating the optimum solution having the smallest total wiring length. Under such circumstances, it is known that when using the approximate solution of the minimum Steiner tree, the shortest wire routing pattern can be generated relatively easily. How to obtain the approximate solution is disclosed in FIG. 3 of Japanese patent publication JP 62-39024 A (1987), which will be referred to as the first publication hereinafter. According to the disclosure of the first publication, the following operations should be carried out. First, there are selected specific two terminals whose distance between them is smallest among possible terminal pairs, and a virtual path is created between the two terminals. Secondary, there is selected a next terminal that is located closest to the virtual path, and an additional path is created between the next terminal and the virtual path to generate a renewed virtual path. A further next terminal is selected similarly, and the virtual path is renewed similarly, and similar operations are repeated for the remaining terminals to generate finally a wire routing pattern that has approximately the smallest total wiring length. This method is disclosed also in FIG. 5 of Japanese patent publication JP 2005-275780 A (2005), which will be referred to as the second publication hereinafter. The method mentioned above will be referred to as the approximate solution of the minimum Steiner tree hereinafter.

The approximate solution of the minimum Steiner tree is useful for easy generation of the wire routing pattern having the smallest total wiring length. The approximate solution, however, has a problem because the driver and the receivers are treated equally or treated with no distinction. This problem will be explained below. Among wiring paths headed from the driver to the receivers, there can be selected one wiring path that has the greatest path length, noting that the number of the wiring paths is equal to the number of the receivers. The greatest path length between the driver and the relevant receiver will be referred to as the greatest D-R path length hereinafter. It can be assumed that there may exist plural kinds of wire routing patterns that have the same smallest total wiring length, and the patterns may have different greatest D-R path lengths. Since the approximate solution of the minimum Steiner tree is the method for generating only one wire routing pattern that has the smallest total wiring length, the generated wire routing pattern not always has the smallest one of the greatest D-R path lengths among the plural wire routing patterns that have the same smallest total wiring length. In other words, in consideration of also the signal flows headed from the driver to the receivers, it is hard to say that the approximate solution of the minimum Steiner tree is the optimum solution.

On the other hand, there is known another method for generating the optimum routing pattern in consideration of the signal flows headed from the driver to the receivers: the method is disclosed in Japanese patent publication JP 11-167564 A (1999), which will be referred to as the third publication hereinafter. The method uses the concept of "overlapping cost" about wiring paths headed from the driver to the receivers. The method can create a common path so as to make the overlapping cost maximum to generate the optimum routing pattern. The method will be referred to as the maximized overlapping cost method hereinafter. The maximized overlapping cost method can always generate the wire routing pattern that has the shortest wiring path between the driver and each of the receivers. The maximized overlapping cost method, however, may generate disadvantageously, depending on an arrangement of terminals, a wire routing pattern having the total wiring path that is greater than that of the pattern generated by the approximate solution of the minimum Steiner tree. Accordingly, the maximized overlapping cost method not always generate the optimum routing pattern that has the smallest total wiring length.

After all, under some arrangements of terminals, the approximate solution of the minimum Steiner tree may generate the optimum routing pattern that has the smallest total wiring length and also the smallest one of the greatest D-R path length. However, under other arrangements of terminals, the approximate solution of the minimum Steiner tree may not generate the pattern that has the smallest one of the greatest D-R path length. On the other hand, under some arrangements of terminals, the maximized overlapping cost method may generate the optimum routing pattern that has the smallest one of the greatest D-R path length and also the smallest total wiring length. However, under other arrangements of terminals, the maximized overlapping cost method may not generate the pattern has the smallest total wiring length.

SUMMARY OF THE INVENTION

It is an object of the present invention to provide a computer program for generating a wire routing pattern that includes wiring paths between one signal-source terminal and a plurality of signal-receiving terminals, the program being capable of automatically generating a wire routing pattern having the smallest total wiring length If there exist a plurality of wire routing patterns having the same smallest total wiring length, the program is capable of automatically generating a wire routing pattern having the smallest one of the greatest D-R path lengths among the wire routing patterns having the same smallest total wiring length.

It is another object of the present invention to provide a method for generating such a wire routing pattern by using a computer that is programmed with the computer program mentioned above.

A summary of the invention will be described below with insertion, for easier understanding, of reference symbols and Figure numbers, in parentheses, which will appear in an explanation of an embodiment regarding the first arrangement of terminals.

A computer program according to the present invention is a program for generating a wire routing pattern that includes wiring paths between one signal-source terminal and a plurality of signal-receiving terminals. The program comprises the functions of:

(a) a terminal-coordinate-acquiring function or a first function, in which the first function acquires a coordinate of the signal-source terminal (symbol D) and respective coordinates of the signal-receiving terminals (R1, R2 and R3), noting that a word of coordinate is defined in a two-dimensional orthogonal coordinate system that is specified by X-axis and Y-axis intersecting with each other at right angles;

(b) a vector-pattern-generating function or a second function, in which the second function generates an initial vector pattern (an initial state shown in FIG. 5) including: a parent node that is located on the signal-source terminal (symbol D); a plurality of child nodes that are located on the signal-receiving terminals (R1, R2 and R3); and a plurality of vectors (D→R1, D→R2 and D→R3) that have a common origin located on the parent node and respective endpoints located on the respective child nodes, the plurality of the vectors being defined as backlog vectors;

(c) an overlapping-vector-generating function or a third function, in which the third function generates all kinds of possible vector pairs each of which is made of any two of the backlog vectors (D→R1, D→R2 and D→R3), and the third function calculates a sum of an overlapping value of X-coordinates and an overlapping value of Y-coordinates for two vectors belonging to each of the possible vector pairs, and the third function selects one vector pair (a pair of D→R2 and D→R3) having a greatest sum of the two overlapping values among the sums of the two overlapping values for the possible vector pairs, and the third function generates a vector having an origin located on the signal-source terminal (symbol D) and an endpoint having a coordinate (8,0) consisting of an X-coordinate that is consistent with the overlapping value of the X-coordinates and a Y-coordinate that is consistent with the overlapping value of the Y-coordinates for the selected vector pair, the generated vector being defined as an overlapping vector;

(d) a first common node-generating function or a fourth function, in which the fourth function generates a first common node (N1) which is located on the endpoint (8,0) of the overlapping vector of the selected vector pair (a pair of D→R2 and D→R3), the fourth function generates two vectors (N1→R2 and N1→R3) having a common origin located on the first common node (N1) and respective endpoints located on the two signal-receiving terminals (R2 and R3) belonging to the selected vector pair (a pair of D→R2 and D→R3), the generated two vectors being defined as route-defined vectors, and the fourth function deletes the two backlog vectors (D→R2 and D→R3) from which the route-defined vectors (N1→R2 and N1→R3) originate, and the fourth function generates a new backlog vector that is consistent with the overlapping vector (D→N1) to generate a renewed vector pattern (a pattern of condition 1 shown in FIG. 6);

(e) a second common node-generating function or a fifth function, in which the fifth function generates a second common node which is located on an endpoint (R2) of a shorter vector (D→R2) of the two vectors (D→R2 and D→R3) belonging to the selected vector pair (a pair D→R2 and D→R3), and the fifth function generates one vector (R2→R3) having an origin located on the second common node (R2) and an endpoint located on an endpoint (R3) of a longer vector (D→R3) of the two vectors (D→R2 and D→R3) belonging to the selected vector pair (a pair of D→R2 and D→R3), the generated one vector (R2→R3) being defined as a route-defined vector, and the fifth function deletes the backlog vector (D→R3) that is consistent with the longer vector (D→R3), and the fifth function leaves the backlog vector (D→R2) that is consistent with the shorter vector (D→R2) to generate another renewed vector pattern (a pattern of condition 2 shown in FIG. 6);

(f) a third common node-generating function or a sixth function, in which the sixth function generates a third common node which is located on the endpoint (R3) of the longer vector (D→R3), and the sixth function generates one vector (R3→R2) having an origin located on the third common node (R3) and an endpoint located on the endpoint (R2) of the shorter vector (D→R2), the generated one vector (R3→R2) being defined as a route-defined vector, and the sixth function deletes the backlog vector (D→R2) that is consistent with the shorter vector (D→R2), and the sixth function leaves the backlog vector (D→R3) that is consistent with the longer vector (D→R3) to generate further another renewed vector pattern (a pattern of condition 3 shown in FIG. 6);

(g) a candidate-routing-pattern-acquiring function, or a seventh function, in which the seventh function determines whether or not only one backlog vector remains every after execution of the fourth, fifth and sixth functions, and if only one backlog vector remains the seventh function acquires a current vector pattern (each pattern of conditions 1-1, 1-2 and 1-3 shown in FIG. 7, conditions 2-1, 2-2 and 2-3 shown in FIG. 8 and conditions 3-1, 3-2 and 3-3 shown in FIG. 9) as a candidate routing pattern, and if plural backlog vectors remain the seventh function acquires a current vector pattern (each pattern of conditions 1, 2 and 3 shown in FIG. 6) as a new backlog pattern;

(h) a backlog-pattern-remainder-determining function or a eighth function, in which the eighth function determines whether or not at least one backlog pattern (each pattern of conditions 1, 2 and 3 shown in FIG. 6) remains, and if at least one backlog pattern remains the eighth function selects any one backlog pattern and repeats, for the selected backlog pattern, execution of the third to the seventh functions, and if no backlog pattern remains the eighth function confirms completion of acquisition of the candidate routing patterns (patterns of conditions 1-1, 1-2 and 1-3 shown in FIG. 7, conditions 2-1, 2-2 and 2-3 shown in FIG. 8 and conditions 3-1, 3-2 and 3-3 shown in FIG. 9);

(i) a total-length-calculation-function or a ninth function, in which the ninth function calculates each total length of the vectors belonging to each of the candidate routing patterns (patterns of conditions 1-1, 1-2 and 1-3 shown in FIG. 7, conditions 2-1, 2-2 and 2-3 shown in FIG. 8 and conditions 3-1, 3-2 and 3-3 shown in FIG. 9) that have been acquired, the total length being defined as a total wiring length (TL); and (j) an optimum-routing-pattern-acquiring function or a tenth function, in which if there is only one candidate routing pattern having a smallest total wiring length (TL=18) among the calculated total wiring lengths (TL) the tenth function acquires the candidate routing pattern having the smallest total wiring length as an optimum routing pattern, and if there are plural candidate routing patterns (patterns of conditions 1-1 and 2-1 shown in FIG. 10) having the same smallest total wiring length (TL=18) the tenth function calculates each length of a wiring path between the signal-source terminal (symbol D) and each of the signal-receiving terminals (R1, R2 and R3) for each of the candidate routing patterns (patterns of conditions 1-1 and 2-1 shown in FIG. 10) having the same smallest total wiring length (TL=18), the calculated length of the wiring path being defined as a D-R path length, and the tenth function compares a greatest one (PL=12) of the D-R path lengths of one candidate routing pattern (a pattern of condition 1-1 shown in FIG. 10) having the same smallest total wiring length (TL=18) with another greatest one (PL=18) of the D-R path lengths of another candidate routing pattern (a pattern of condition 2-1 shown in FIG. 10) having the same smallest total wiring length (TL=18) to determine a smallest one (TL=12) of the greatest D-R path lengths, and the tenth function acquires the candidate routing pattern (a pattern of condition 1-1 shown in FIG. 10) having the smallest one (TL=12) of the greatest D-R path lengths as an optimum routing pattern.

A method according to the present invention is a method for generating, by using a computer that is programmed, a wire routing pattern that includes wiring paths between one signal-source terminal and a plurality of signal-receiving terminals. The method comprises the steps of:

(a) a terminal-coordinate-acquiring step or a first step, in which the first step acquires a coordinate of the signal-source terminal (symbol D) and respective coordinates of the signal-receiving terminals (R1, R2 and R3), noting that a word of coordinate is defined in a two-dimensional orthogonal coordinate system that is specified by X-axis and Y-axis intersecting with each other at right angles;

(b) a vector-pattern-generating step or a second step, in which the second step generates an initial vector pattern (an initial state shown in FIG. 5) including: a parent node that is located on the signal-source terminal (symbol D); a plurality of child nodes that are located on the signal-receiving terminals (R1, R2 and R3); and a plurality of vectors (D→R1, D→R2 and D→R3) that have a common origin located on the parent node and respective endpoints located on the respective child nodes, the plurality of the vectors being defined as backlog vectors;

(c) an overlapping-vector-generating step or a third step, in which the third step generates all kinds of possible vector pairs each of which is made of any two of the backlog vectors (D→R1, D→R2 and D→R3), and the third step calculates a sum of an overlapping value of X-coordinates and an overlapping value of Y-coordinates for two vectors belonging to each of the possible vector pairs, and the third step selects one vector pair (a pair of D→R2 and D→R3) having a greatest sum of the two overlapping values among the sums of the two overlapping values for the possible vector pairs, and the third step generates a vector having an origin located on the signal-source terminal (symbol D) and an endpoint having a coordinate (8,0) consisting of an X-coordinate that is consistent with the overlapping value of the X-coordinates and a Y-coordinate that is consistent with the overlapping value of the Y-coordinates for the selected vector pair, the generated vector being defined as an overlapping vector;

(d) a first common node-generating step or a fourth step, in which the fourth step generates a first common node (N1) which is located on the endpoint (8,0) of the overlapping vector of the selected vector pair (a pair of D→R2 and D→R3), the fourth step generates two vectors (N1→R2 and N1→R3) having a common origin located on the first common node (N1) and respective endpoints located on the two signal-receiving terminals (R2 and R3) belonging to the selected vector pair (a pair of D→R2 and D→R3), the generated two vectors being defined as route-defined vectors, and the fourth step deletes the two backlog vectors (D→R2 and D→R3) from which the route-defined vectors (N1→R2 and N1→R3) originate, and the fourth step generates a new backlog vector that is consistent with the overlapping vector (D→N1) to generate a renewed vector pattern (a pattern of condition 1 shown in FIG. 6);

(e) a second common node-generating step or a fifth step, in which the fifth step generates a second common node which is located on an endpoint (R2) of a shorter vector (D→R2) of the two vectors (D→R2 and D→R3) belonging to the selected vector pair (a pair of D→R2 and D→R3), and the fifth step generates one vector (R2→R3) having an origin located on the second common node (R2) and an endpoint located on an endpoint (R3) of a longer vector (D→R3) of the two vectors (D→R2 and D→R3) belonging to the selected vector pair (a pair of D→R2 and D→R3), the generated one vector (R2→R3) being defined as a out defined vector, and the fifth step deletes the backlog vector (D→R3) that is consistent with the longer vector (D→R3), and the fifth step leaves the backlog vector (D→R2) that is consistent with the shorter vector (D→R2) to generate another renewed vector pattern (a pattern of condition 2 shown in FIG. 6);

(f) a third common node-generating step or a sixth step, in which the sixth step generates a third common node which is located on the endpoint (R3) of the longer vector (D→R3), and the sixth step generates one vector (R3→R2) having an origin located on the third common node (R3) and an endpoint located on the endpoint (R2) of the shorter vector (D→R2), the generated one vector (R3→R2) being defined as a route-defined vector, and the sixth step deletes the backlog vector (D→R2) that is consistent with the shorter vector (D→R2), and the sixth step leaves the backlog vector (D→R3) that is consistent with the longer vector (D→R3) to generate further another renewed vector pattern (a pattern of condition 3 shown in FIG. 6);

(g) a candidate-routing-pattern-acquiring step or seventh step, in which the seventh step determines whether or not only one backlog vector remains every after execution of the fourth, fifth and sixth steps, and only one backlog vector remains the seventh step acquires a current vector pattern (each pattern of conditions 1-1, 1-2 and 1-3 shown in FIG. 7, conditions 2-1, 2-2 and 2-3 shown in FIG. 8 and conditions 3-1, 3-2 and 3-3 shown in FIG. 9) as a candidate routing pattern, and if plural backlog vectors remain the seventh step acquires a current vector pattern (each pattern of conditions 1, 2 and 3 shown in FIG. 6) as a new backlog pattern;

(h) a backlog-pattern-remainder-determining step or a eighth step, in which the eighth step determines whether or not at least one backlog pattern (each pattern of conditions 1, 2 and 3 shown in FIG. 6) remains, and if at least one backlog pattern remains the eighth step selects any one backlog pattern and repeats, for the selected backlog pattern, execution of the third to the seventh steps, and if no backlog pattern remains the eighth step confirms completion of acquisition of the candidate routing patterns (patterns of conditions 1-1, 1-2 and 1-3 shown in FIG. 7, conditions 2-1, 2-2 and 2-3 shown in FIG. 8 and conditions 3-1, 3-2 and 3-3 shown in FIG. 9);

(i) a total-length-calculation-step or a ninth step, in which the ninth step calculates each total length of the vectors belonging to each of the candidate routing patterns (patterns of conditions 1-1, 1-2 and 1-3 shown in FIG. 7, conditions 2-1, 2-2 and 2-3 shown in FIG. 8 and conditions 3-1, 3-2 and 3-3 shown in FIG. 9) that have been acquired, the total length being defined as a total wiring length (TL); and (j) an optimum-routing-pattern-acquiring step or a tenth step, in which if there is only one candidate routing pattern having a smallest total wiring length (TL=18) among the calculated total wiring lengths (TL) the tenth step acquires the candidate routing pattern having the smallest total wiring length as an optimum routing pattern, and if there are plural candidate routing patterns (patterns of conditions 1-1 and 2-1 shown in FIG. 10) having the same smallest total wiring length (TL=18) the tenth step calculates each length of a wiring path between the signal-source terminal (symbol D) and each of the signal-receiving terminals (R1, R2 and R3) for each of the candidate routing patterns (patterns of conditions 1-1 and 2-1 shown in FIG. 10) having the same smallest total wiring length (TL=18), the calculated length of the wiring path being defined as a D-R path length, and the tenth step compares a greatest one (PL=12) of the D-R path lengths of one candidate routing pattern (a pattern of condition 1-1 shown in FIG. 10) having the same smallest total wiring length (TL=18) with another greatest one (PL=18) of the D-R path lengths of another candidate routing pattern (a pattern of condition 2-1 shown in FIG. 10) having the same smallest total wiring length (TL=18) to determine a smallest one (TL=12) of the greatest D-R path lengths, and the tenth step acquires the candidate routing pattern (a pattern of condition 1-1 shown in FIG. 10) having the smallest one (TL=12) of the greatest D-R path lengths as an optimum routing pattern.

The present invention has the advantage described below. The computer program according to the present invention can generate a wire routing pattern for connecting one driver with a plurality of receivers. The pattern is automatically generated and it has the smallest total wiring length. If there exist plural patterns that have the same smallest total wiring length, the program can select one pattern that has the smallest one of the greatest D-R path lengths among the patterns that have the same smallest total wiring length. With the present invention, it is not necessary to inspect all of possible candidate routing patterns, i.e., it is sufficient to consider only the specific conditions for generating the optimum routing pattern, so that the number of candidate routing patterns which should be considered can be reduced.

DETAILED DESCRIPTION OF THE PREFERRED EMBODIMENTS

Figure 1:
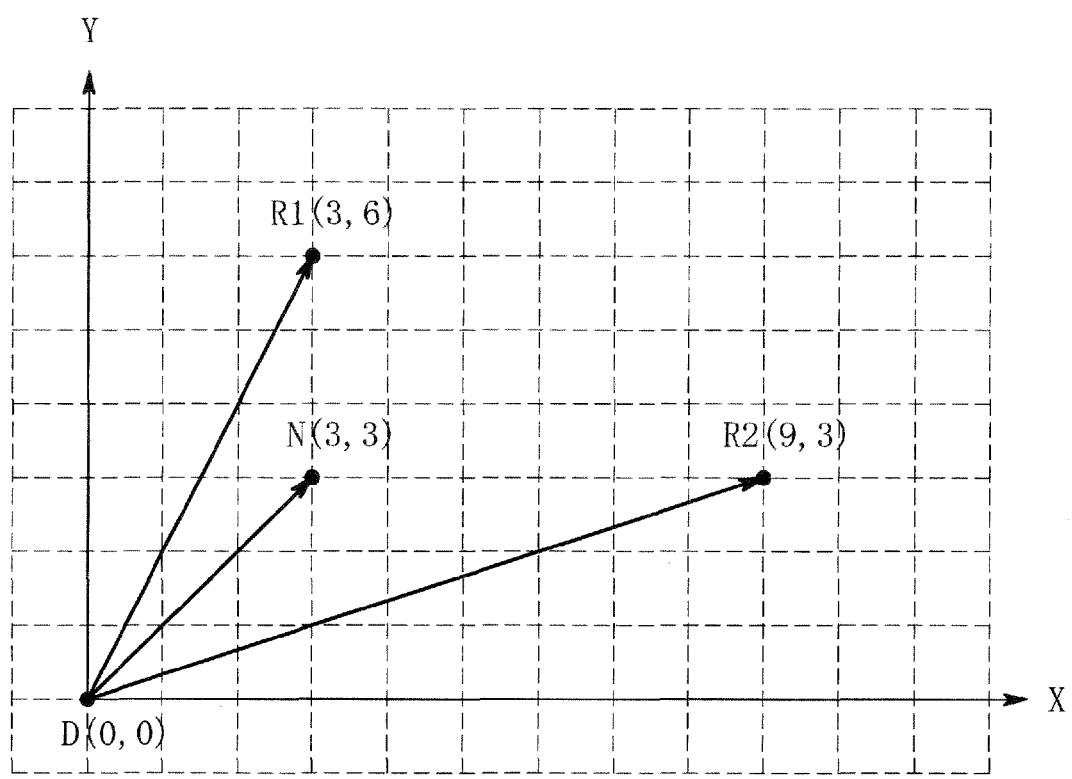
FIG. 1 is an explanatory view for explaining an overlapping vector, which is used in the present invention.

Embodiments of the present invention will now be described in detail below with reference to the drawings. Referring to FIG. 1, there is shown an explanatory view for explaining the concept of "overlapping vector", which is used in the present invention. A signal-source terminal will be referred to as a driver, which is denoted by a symbol D. A signal-receiving terminal will be referred to as a receiver, which is denoted by a symbol R. In a two-dimensional orthogonal coordinate system that is specified by X-axis and Y-axis intersecting with each other at right angles, it is assumed that one driver D and two receivers R1 and R2 are arranged. The driver D has a coordinate (0,0), which is the origin of the coordinate system. The receiver R1 has a coordinate (3,6) and the receiver R2 has a coordinate (9,3). Two vectors may be created: a vector D→R1 that is headed from the driver D to the receiver R1, and another vector D→R2 that is headed from the driver D to the receiver R2. The concept of "overlapping vector" about a pair of vectors is defined as described below. The overlapping vector is defined as a vector having an origin located on the driver and an endpoint having a coordinate consisting of an X-coordinate that is consistent with the overlapping value of the X-coordinates of the two vectors and a Y-coordinate that is consistent with the overlapping value of the Y-coordinates of the two vectors. In FIG. 1, the X-coordinates of the two vectors are three and nine, and thus the overlapping value of the X-coordinates is three. The Y-coordinates of the two vectors are six and three, and this the overlapping value of the Y-coordinates is three. Therefore, the endpoint of the overlapping vector has a coordinate (3,3). The origin of the overlapping vector has a coordinate (0,0), which is consistent with the location of the driver D. The endpoint of the overlapping vector may become the first common node, which will be explained later, and the endpoint is denoted by a symbol N. It is noted that the overlapping value should be determined in consideration of positive or negative coordinate values. Namely, the overlapping value between a positive coordinate value and a negative coordinate value becomes zero.

The overlapping vector D→N has a length, which is defined as an "overlapping length". It should be noted, in the Specification of the present application, that "length" of a vector is defined as the minimum distance between the origin and the endpoint of the vector along the X-axis and the Y-axis, i.e., the length is consistent with the Manhattan distance. Explaining it in FIG. 1, the length of the overlapping vector D→N is six, which is the sum of three that is a length along the X-axis and three that is a length along the Y-axis. Since the present invention relates to a program for generating a wire routing pattern and a direction of any wiring path should be limited to a direction only along the X-axis or the Y-axis, it is convenient to define the length of a vector (i.e., a length of a wiring path) as a distance along the two orthogonal axes.

The "overlapping length" of a vector pair is an important factor for generating a wire routing pattern having a smaller total wiring length. Considering the connection between the driver D and each of the receivers R1 and R2, if a common wiring path may be created part of the ways to the receivers, the total wiring length would become smaller than the case of independent connections between the driver and the respective receivers. Considering some vector pairs, the longer the overlapping length of the vector pair is, the higher the routing commonality of wiring paths is.

The program according to the present invention provides three choices for generating common path part of the ways to the endpoints of the relevant vector pair. The endpoint of the common path is referred to as a common node. There are three ways regarding how to determine the common node. Namely, the present invention discusses possible wire routing patterns with the use of the first to the third common nodes.

Figure 2:
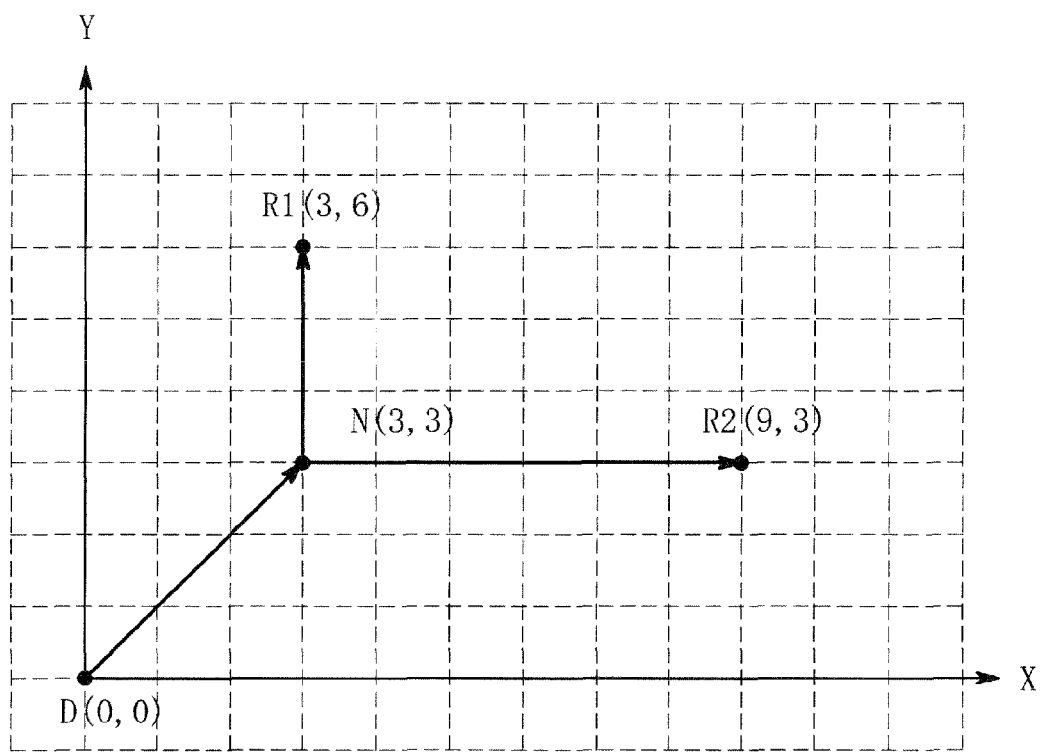
FIG. 2 is an explanatory view for explaining the common node.

Referring to FIG. 2, there is shown an explanatory view for explaining the first common node. The first common node is located on the endpoint N of the overlapping vector D→N. The common path extends from the driver D to the first common node N, and the computer creates new two different paths that extend from the first common node N to the respective receivers R1 and R2.

Figure 3:
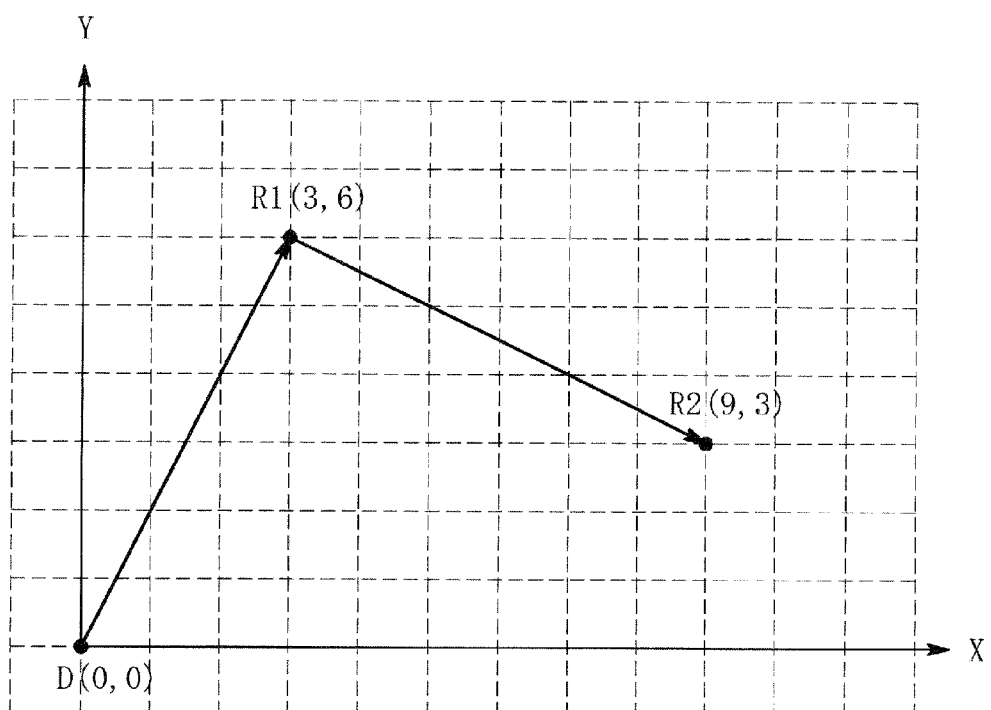
FIG. 3 is an explanatory view for explaining the second common node.

Referring to FIG. 3, there is shown an explanatory view for explaining the second common node. The second common node is located on the endpoint R1 of the shorter vector D→R1 among the two vectors belonging to the relevant vector pair. The common path extends from the driver D to the second common node that is consistent with the receiver R1, and the computer creates an additional path that extends from the second common node R1 to the receiver R2.

Figure 4:
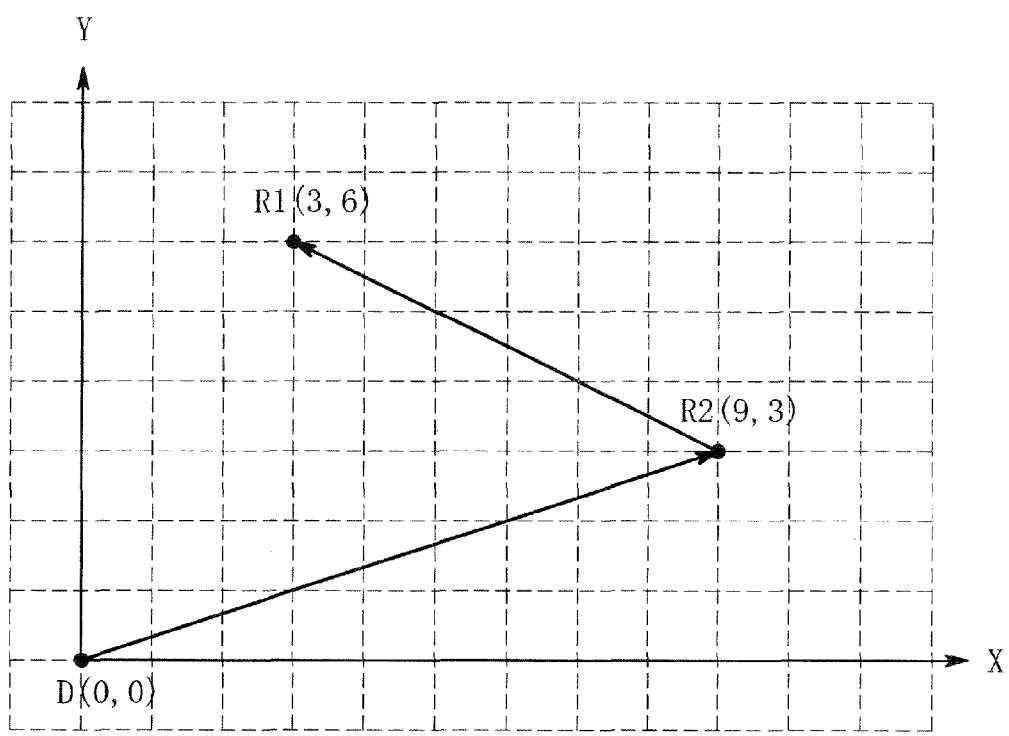
FIG. 4 is an explanatory view for explaining the third common node.

Referring to FIG. 4, there is shown an explanatory view for explaining the third common node. The third common node is located on the endpoint R2 of the longer vector D→R2 among the two vectors belonging to the relevant vector pair. The common path extends from the driver D to the third common node that is consistent with the receiver R2, and the computer creates an additional path that extends from the third common node R2 to the receiver R1.

Figure 5:
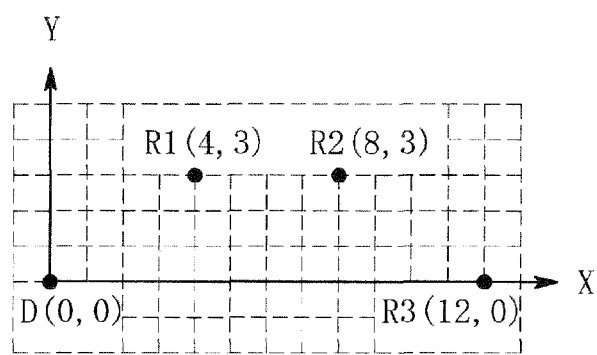
FIG. 5 shows the first arrangement of terminals and the initial state of a vector pattern for which a wire routing pattern should be discussed.
Figure 5:
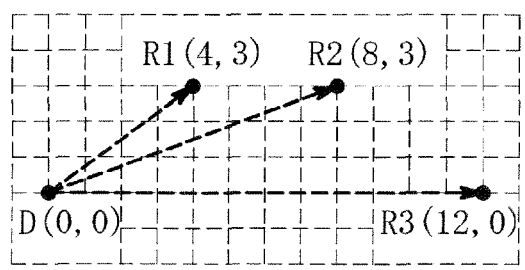
Figure 5:
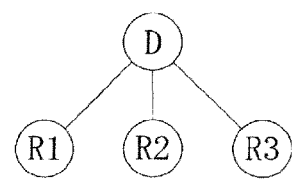

Next, there will be described the principle of the present invention with the use of some specific arrangements of terminals. Referring to FIG. 5, there is shown the first arrangement of terminals and its initial state of a vector pattern. The first arrangement includes one driver D and three receivers R1, R2 and R3. The driver D has a coordinate (0,0), which is the origin of the coordinate system. The receiver R1 has a coordinate (4,3), the receiver R2 has a coordinate (8,3) and the receiver R3 has a coordinate (12,0). The initial vector pattern includes three vectors that extend from the driver to the respective receivers: a vector D→R1 headed from the driver to the receiver R1, a vector D→R2 headed from the driver to the receiver R2 and a vector D→R3 headed from the driver to the receiver R3. The purpose of this program is to make some common paths part of the ways to the respective receivers to generate the optimum routing pattern having the smallest total wiring length. A vector that has not been determined as a wiring path will, be referred to as a "backlog vector", which is depicted by a broken line in FIG. 5 and also in other figures later. All of the vectors in the initial state of the vector pattern shown in FIG. 5 are the backlog vectors and thus they are depicted by broken lines. A tree structure is shown at the right side of the initial state of the vector pattern. The tree structure indicates vectors headed from the driver to the respective receivers. In the initial state, the tree structure includes three connection lines, which are parallel to each other, between the driver D and the respective receivers R1, R2 and R3.

The first operation that must be done in the initial state of the vector pattern is to select a vector pair that has the greatest overlapping length. The initial state of the vector pattern includes three vectors. One vector pair may be made of any two vectors among the three vectors. The number of possible vector pairs is equal to the number of the combinations of three objects taken two at a time, i.e., the number is calculated by three times two further divided by two, the result being three ways. Considering the first vector pair that is a combination of the vector D→R1 and the vector D→R2, the first vector pair provides an overlapping vector, which is consistent with the vector D→R1 and has an overlapping length that is seven (i.e., the sum of four and three). Considering the second vector pair that is a combination of the vector D→R2 and the vector D→R3, the second vector pair provides another overlapping vector, which has an endpoint located on a coordinate (8,0) and has an overlapping length that is eight. Considering the third vector pair that is a combination of the vector D→R1 and the vector D→R3, the third vector pair provides a further another overlapping vector, which has an endpoint located on a coordinate (4,0) and has an overlapping length that is four. Accordingly, the vector pair that has the greatest overlapping length is a combination of the vector D→R2 and the vector D→R3. This vector pair is selected and thus it becomes a "selected vector pair".

Figure 6:
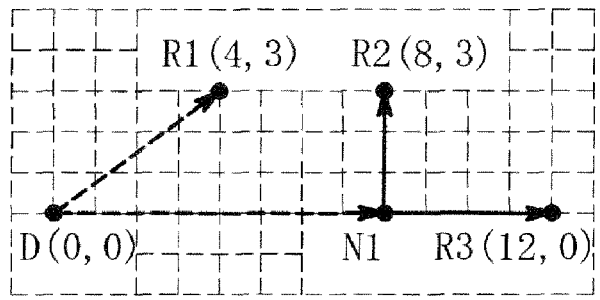
FIG. 6 shows vector patterns of conditions 1, 2 and 3.
Figure 6:
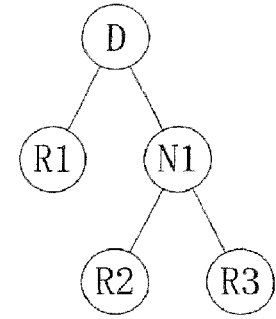
Figure 6:
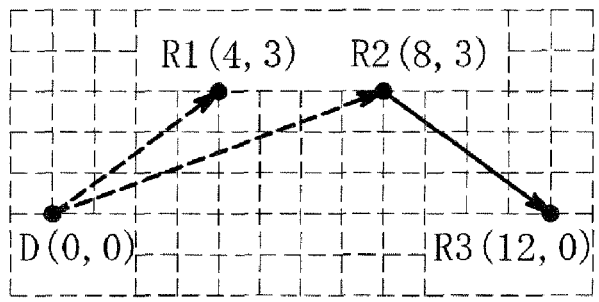
Figure 6:
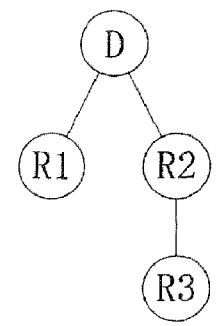
Figure 6:
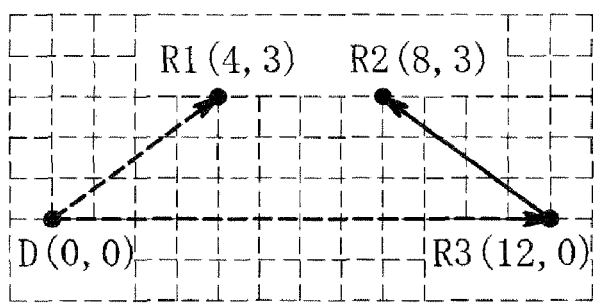
Figure 6:
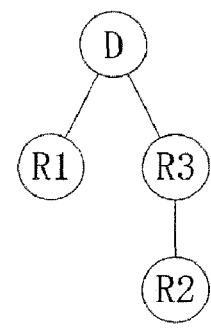

Referring to FIG. 6, there are shown three vector patterns under the conditions 1, 2 and 3 for the relevant selected vector pair. These vector patterns are obtained by adopting three different common nodes for the selected vector pair to become renewed vector patterns, which are higher in routing commonality than the initial state.

The vector pattern under the condition 1 is obtained by adopting the first common node N1, which is located on the endpoint (8,0) of the overlapping vector. The computer creates a vector headed from the first common node N1 to the receiver R2 and another vector headed from the first common node N1 to the receiver R3, these vectors being defined as route-defined vectors. The route-defined vector is depicted by a solid line in FIG. 6 and also in other figures later. A vector headed from the driver D to the first common node N1 becomes a new backlog vector. With the operations mentioned above, the number of the backlog vectors decreases by one. Namely, the three backlog vectors are converted to the two backlog vectors D→R1 and D→N1. Referring to the tree structure shown at the right side of the vector pattern condition 1, only R1 and N1 are connected directly to the driver D. The receivers R2 and R3 exist on the lower layer and are connected to N1.

The vector pattern under the condition 2 is obtained by adopting the second common node, which is located on the endpoint (8,3) of the shorter vector D→R2 among the two vectors belonging to the selected vector pair, the second common node being consistent with the receiver R2. The computer creates a vector headed from the second common node R2 to the receiver R3, this vector being defined as a route-defined vector. The vector headed from the driver D to the second common node R2 remains as it is as the backlog vector. With the operations also under the condition 2, the number of the backlog vectors decreases by one. Namely, the three backlog vectors are converted to the two backlog vectors D→R1 and D→R2. Referring to the tree structure shown at the right side of the vector pattern of condition 2, only R1 and R2 are connected directly to the driver D. The receiver R3 exists on the lower layer and is connected to R2.

The vector pattern under the condition 3 is obtained by adopting the third common node, which is located on the endpoint (12,0) of the longer vector D→R3 among the two vectors belonging to the selected vector pair, the third common node being consistent with the receiver R3. The computer creates a vector headed from the third common node R3 to the receiver R2, this vector being defined as a route-defined vector. The vector headed from the driver D to the third common node R3 remains as it is as the backlog vector. With the operations also under the condition 3, the number of the backlog vectors decreases by one. Namely, the three backlog vectors are converted to the two backlog vectors D→R1 and D→R3. Referring to the tree structure shown at the right side of the vector pattern of condition 3, only R1 and R3 are connected directly to the driver D. The receiver R2 exists on the lower layer and is connected to R3.

It is seen, from the vector patterns of conditions 1, 2 and 3, that two backlog vectors remain in the respective vector patterns. This means that these vector patterns require further operations for reducing the number of the backlog vectors.

Figure 7:
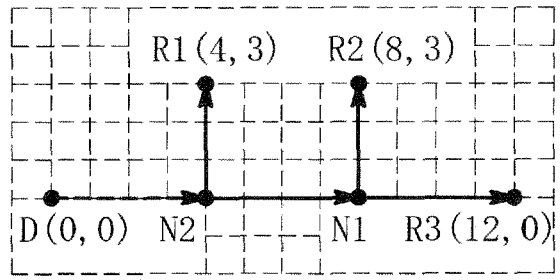
FIG. 7 shows vector patterns of conditions 1-1, 1-2 and 1-3.
Figure 7:
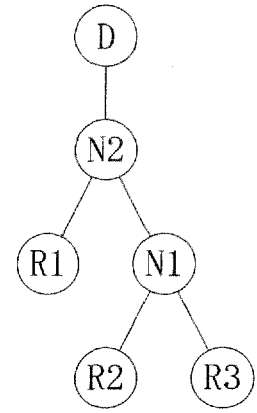
Figure 7:
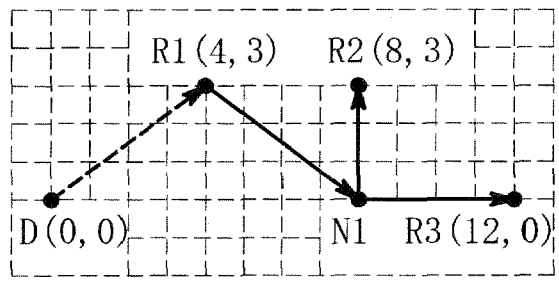
Figure 7:
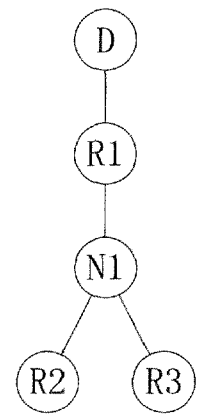
Figure 7:
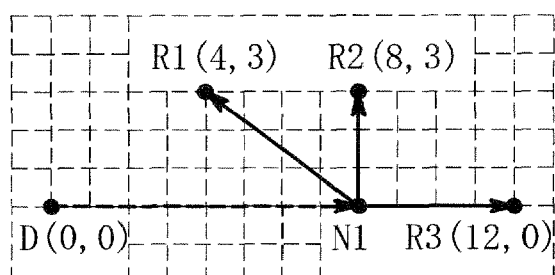
Figure 7:
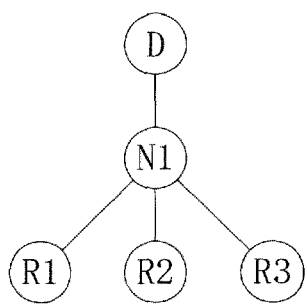

Referring to FIG. 7, there are shown three vector patterns under the conditions 1-1, 1-2 and 1-3. These vector patterns are obtained by adopting three different common nodes for the vector pattern under the condition 1 shown in FIG. 6 to become renewed vector patterns. Since the vector pattern of condition 1 includes only two backlog vectors D→R1 and D→N1, only one kind of vector pair may be created and it becomes the selected vector pair. The overlapping vector of the selected vector pair has an endpoint (4,0).

The vector pattern under the condition 1-1 shown in FIG. 7 may be obtained, for the vector pattern under the condition 1 shown in FIG. 6, by adopting the first common node N2, which is located on the endpoint (4,0) of the overlapping vector. The computer creates a vector headed from the first common node N2 to the receiver R1 and another vector headed from the first common node N2 to the old first common node N1, these vectors being defined as route-defined vectors. A vector headed from the driver D to the first common node N2 becomes a new backlog vector. With the operations mentioned above, the number of the backlog vectors decreases by one. Namely, the two backlog vectors are converted to only one backlog vector D→R2. When only one backlog remains, a current vector pattern is acquired as a candidate routing pattern. In other words, wiring paths may be created along the vector pattern of condition 1-1 to complete a wiring route as a candidate. It should be noted that wiring paths along the vectors must consist of combinations of only paths that are parallel to the X-axis or Y-axis.

The vector pattern under the condition 1-2 shown in FIG. 7 may be obtained, for the vector pattern under the condition 1 shown in FIG. 6, by adopting the second common node, which is located on the endpoint (4,3) of the shorter vector D→R1 among the two vectors belonging to the selected vector pair, the second common node being consistent with the receiver R1. The computer creates a vector headed from the second common node R1 to the old first common node N1, this vector being defined as a route-defined vector. The vector headed from the driver D to the second common node R1 remains as it is as the backlog vector. With the operations mentioned above, the number of the backlog vectors decreases by one. Namely, the two backlog vectors are converted to only one backlog vector D→R1. Since only one backlog remains, a current vector pattern is acquired as a candidate routing pattern.

The vector pattern under the condition 1-3 shown in FIG. 7 may be obtained, for the vector pattern under the condition 1 shown in FIG. 6, by adopting the third common node, which is located on the endpoint (8,0) of the longer vector D→N1 among the two vectors belonging to the selected vector pair, the third common node being consistent with the old first common node N1. The computer creates a vector headed from the third common node N1 to the receiver R1, this vector being defined as a route-defined vector. The vector headed from the driver D to the third common node N1 remains as it is as the backlog vector. With the operations mentioned above, the number of the backlog vectors decreases by one. Namely, the two backlog vectors are converted to only one backlog vector D→N1. Since only one backlog vector remains, a current vector pattern is acquired as a candidate routing pattern.

Figure 8:
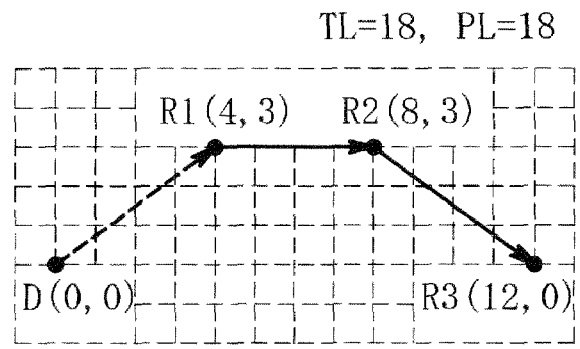
FIG. 8 shows vector patterns of conditions 2-1, 2-2 and 2-3.
Figure 8:
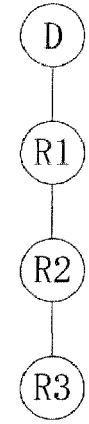
Figure 8:
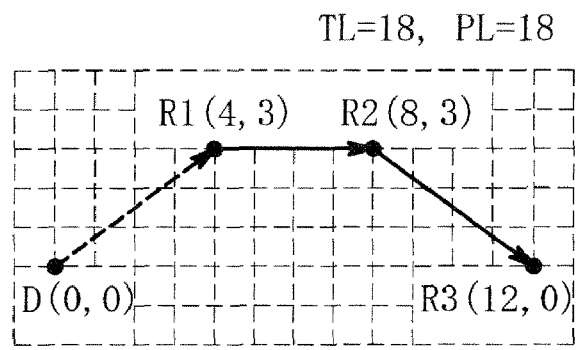
Figure 8:
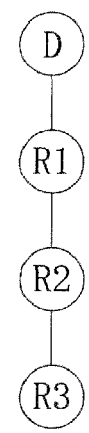
Figure 8:
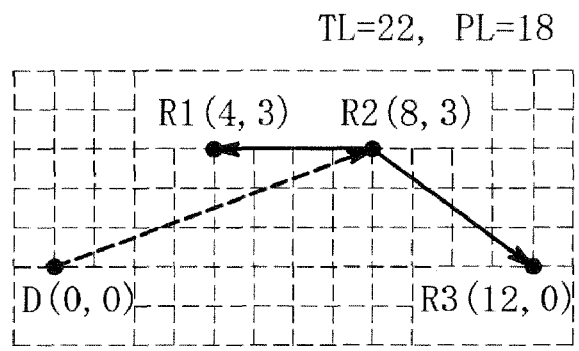
Figure 8:
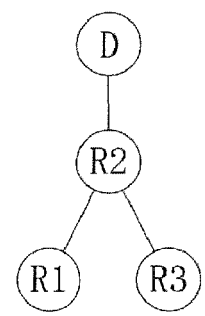

Referring to FIG. 8, there are shown three vector patterns under the conditions 2-1, 2-2 and 2-3. These vector patterns are obtained by adopting three different common nodes for the vector pattern under the condition 2 shown in FIG. 6 to become renewed vector patterns. Since the vector pattern of condition 2 includes only two backlog vectors, only one kind of vector pair may be created and it becomes the selected vector pair. The overlapping vector of the selected vector pair has an endpoint (4,3), which is located on the receiver R1.

The vector pattern under the condition 2-1 shown in FIG. 8 may be obtained, for the vector pattern under the condition 2 shown in FIG. 6, by adopting the first common node, which is located on the endpoint (4,3) of the overlapping vector, i.e., it is located on the receiver R1. The computer creates a vector headed from the first common node R1 to endpoint (which is located on the same point as the first common node R1) of the shorter vector (i.e., the created vector is a zero vector) and another vector headed from the first common node R1 to the receiver R2, these vectors being defined as route-defined vectors. A vector headed from the driver D to the first common node R1 becomes a new backlog vector, which is consistent with the shorter vector. With the operations mentioned above, the number of the backlog vectors decreases by one. Namely, the two backlog vectors are converted to only one backlog vector D→R1. Since only one backlog remains, a current vector pattern is acquired as a candidate routing pattern.

The vector pattern under the condition 2-2 shown in FIG. 8 may be obtained, for the vector pattern under the condition 2 shown in FIG. 6, by adopting the second common node, which is located on the endpoint (4,3) of the shorter vector D→R1 among the two vectors belonging to the selected vector pair, the second common node being consistent with the receiver R1. The second common node of condition 2-2 is consistent with the first common node of condition 2-1, because the selected vector pair of condition 2-2 has an overlapping vector that is consistent with the shorter vector. Therefore, the vector pattern of condition 2-2 is the same as the vector pattern of condition 2-1. This vector pattern is acquired as a candidate routing pattern. Alternatively, since the vector pattern of condition 2-2 is the same as the vector pattern of condition 2-1, acquisition of the vector pattern of condition 2-2 as a candidate may be omitted.

The vector pattern under the condition 2-3 shown in FIG. 8 may be obtained, for the vector pattern under the condition 2 shown in FIG. 6, by adopting the third common node, which is located on the endpoint (8,3) of the longer vector D→R2 among the two vectors belonging to the selected vector pair. The computer creates a vector headed from the third common node R2 to the receiver R1, this vector being defined as a route-defined vector. The vector headed from the driver D to the third common node R2 remains as it is as the backlog vector. With the operations mentioned above, the number of the backlog vectors decreases by one. Namely, the two backlog vectors are converted to only one backlog vector D→R2. Since only one backlog vector remains, a current vector pattern is acquired as a candidate routing pattern.

Figure 9:
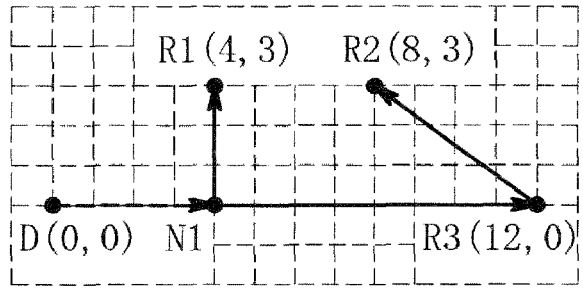
FIG. 9 shows vector patterns of conditions 3-1, 3-2 and 3-3.
Figure 9:
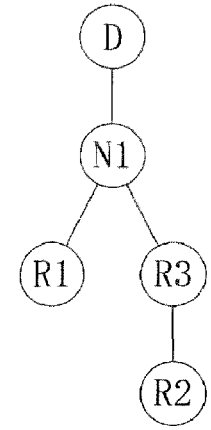
Figure 9:
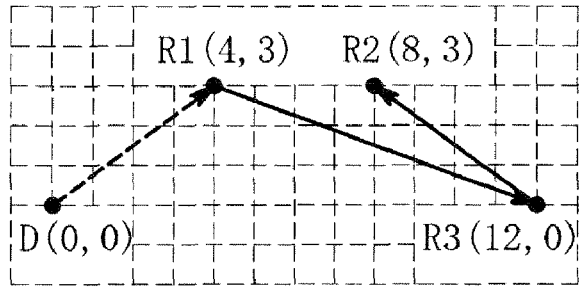
Figure 9:
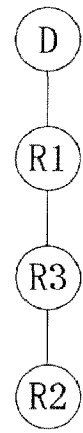
Figure 9:
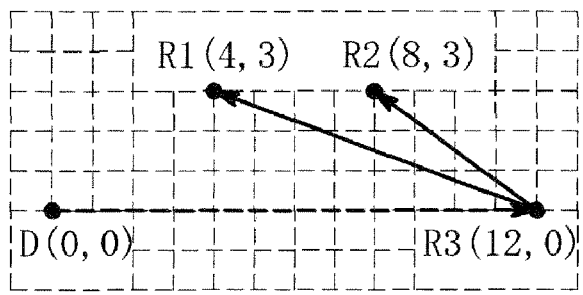
Figure 9:
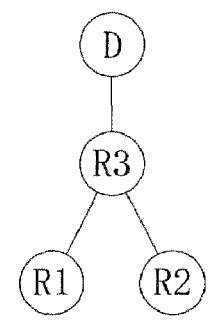

Referring to FIG. 9, there are shown three vector patterns under the conditions 3-1, 3-2 and 3-3. These vector patterns are obtained by adopting three different common nodes for the vector pattern under the condition 3 shown in FIG. 6 to become renewed vector patterns. Since the vector pattern of condition 3 includes only two backlog vectors, only one kind of vector pair may be created and it becomes the selected vector pair. The overlapping vector of the selected vector pair has an endpoint (4,0).

The vector pattern under the condition 3-1 shown in FIG. 9 may be obtained, for the vector pattern under the condition 3 shown in FIG. 6, by adopting the first common node N1, which is located on the endpoint (4,0) of the overlapping vector. The computer creates a vector headed from the first common node N1 to the receiver R1 and another vector headed from the first common node N1 to the receiver R3, these vectors being defined as route-defined vectors. A vector headed from the driver D to the first common node N1 becomes a new backlog vector. With the operations mentioned above, the number of the backlog vectors decreases by one. Namely, the two backlog vectors are converted to only one backlog vector D→N1. Since only one backlog remains, a current vector pattern is acquired as a candidate routing pattern.

The vector pattern under the condition 3-2 shown in FIG. 9 may be obtained, for the vector pattern under the condition 3 shown in FIG. 6, by adopting the second common node, which is located on the endpoint (4,3) of the shorter vector D→R1 among the two vectors belonging to the selected vector pair, the second common node being consistent with the receiver R1. The computer creates a vector headed from the second common node R1 to the receiver R3, this vector being defined as a route-defined vector. The vector headed from the driver D to the second common node R1 remains as it is as the backlog vector. With the operations mentioned above, the number of the backlog vectors decreases by one. Namely, the two backlog vectors are converted to only one backlog vector D→R1. Since only one backlog remains, a current vector pattern is acquired as a candidate routing pattern.

The vector pattern under the condition 3-3 shown in FIG. 9 may be obtained, for the vector pattern under the condition 3 shown in FIG. 6, by adopting the third common node, which is located on the endpoint (12,0) of the longer vector D→R3 among the two vectors belonging to the selected vector pair. The computer creates a vector headed from the third common node R3 to the receiver R1, this vector being defined as a route-defined vector. The vector headed from the driver D to the third common node R3 remains as it is as the backlog vector. With the operations mentioned above, the number of the backlog vectors decreases by one. Namely, the two backlog vectors are converted to only one backlog vector D→R3. Since only one backlog vector remains, a current vector pattern is acquired as a candidate routing pattern.

With the operations mentioned above, the backlog vector patterns, which include two or more backlog vectors, disappear, and thus the acquisition of the candidate routing patterns has been completed.

Next, the total wiring length must be calculated for the acquired plural candidate routing patterns, which are nine kinds of vector patterns under the conditions 1-1 to 3-3 in this embodiment. Explaining it for the condition 1-1 shown in FIG. 7 for example, the total wiring length, which is denoted by a symbol TL, is equal to the sum of the lengths of the vectors that exist in the vector pattern. The sum is eighteen. This value is seen in FIG. 7 at the upper right of the vector pattern of condition 1-1 as TL=18. Another indexical length will be explained. The length of a wiring path that connects the driver with one of the receivers is defined as a D-R path length. The number of the receivers is three, and thus there are three kinds of the D-R path lengths. The D-R path length between the driver D and the receiver R1 is seven. The D-R path length between the driver D and the receiver R2 is eleven. The D-R path length between the driver D and the receiver R3 is twelve. The greatest one among the three D-R path lengths is defined as the greatest D-R path length, which is denoted by a symbol PL. The PL is twelve for the condition 1-1. The PL value is seen in FIG. 7 also at the upper right of the vector pattern of condition 1-1 as PL=12.

Regarding the condition 1-2 shown in FIG. 7, the total wiring length TL is twenty one. It should be noted, in calculation of the sum of the lengths of wiring paths, that the length of a wiring path along the vector D→R1 must be the sum of a distance along the X-axis and another distance along the Y-axis: the sum is seven. The length of a wiring path along the vector R1→N1 can be calculated similarly: the sum is seven. The greatest D-R path length PL is eighteen.

Regarding the other conditions, i.e., condition 1-3 shown in FIG. 7, conditions 2-1, 2-2 and 2-3 shown in FIG. 8 and conditions 3-1, 3-2 and 3-3 shown in FIG. 9, the values of the total wiring length TL and the greatest D-R path length PL are seen in the upper right of the relevant vector patterns.

Comparing the plural total wiring lengths with one another among the nine candidate routing patterns, it is seen that the smallest total wiring length is eighteen, and further that there are two candidate routing patterns that has the same smallest total wiring length, eighteen: they are the patterns of condition 1-1 and condition 2-1. These two patterns are shown together in FIG. 10. When there exist plural candidate routing patterns that has the same smallest total wiring length as in this embodiment, further comparison is necessary, i.e., the greatest D-R path lengths must be compared with one another among the candidate routing patterns that has the same smallest total wiring length. The greatest D-R path length PL of condition 1-1 is twelve, while the greatest D-R path length PL of condition 2-1 is eighteen: the former is smaller than the latter. Accordingly, the program acquires the candidate routing pattern of condition 1-1 as the definite optimum routing pattern.

Figure 11:
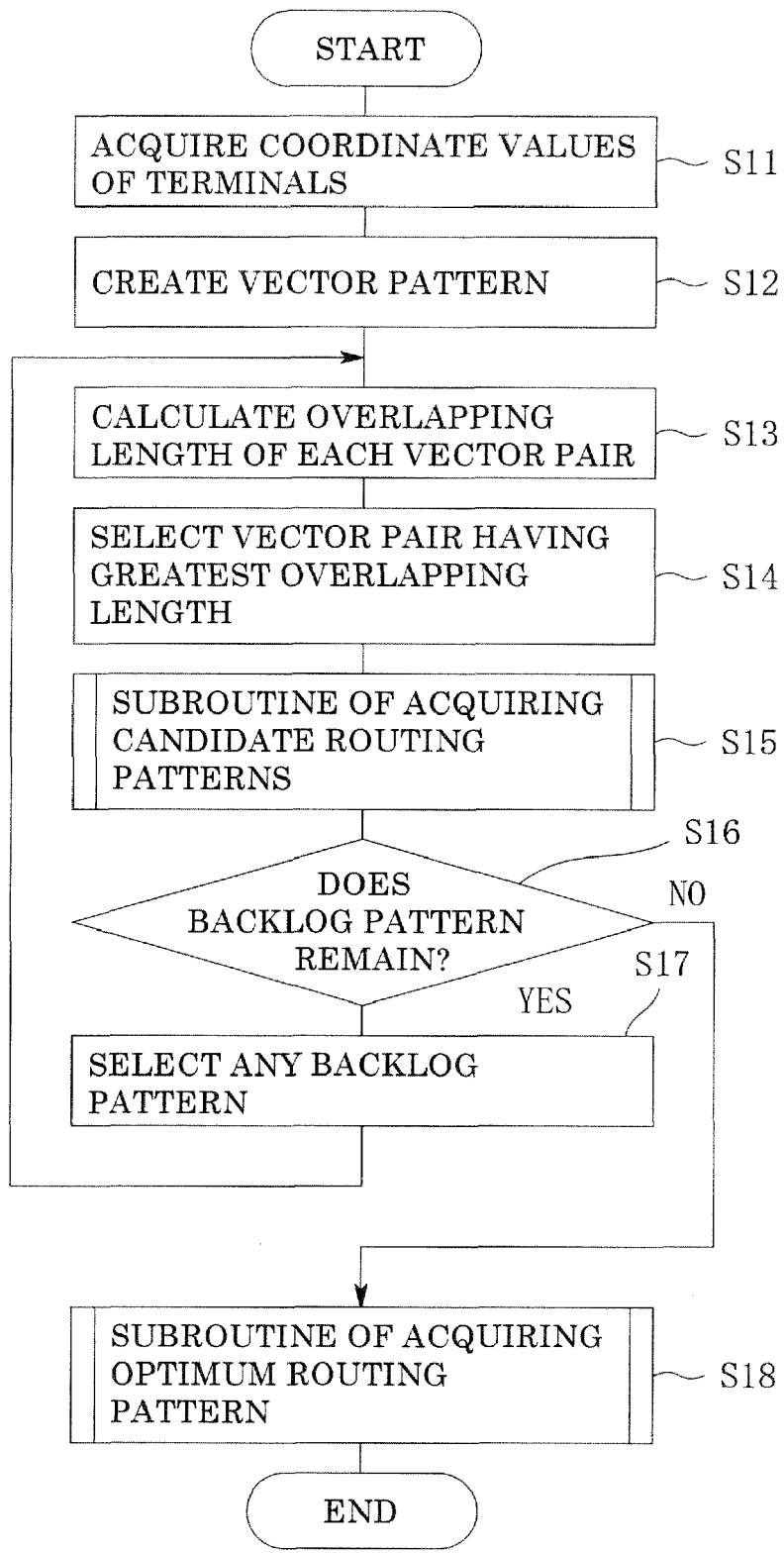
FIG. 11 is a flowchart indicating functions that are executed by the program according to the present invention.
Figure 12:
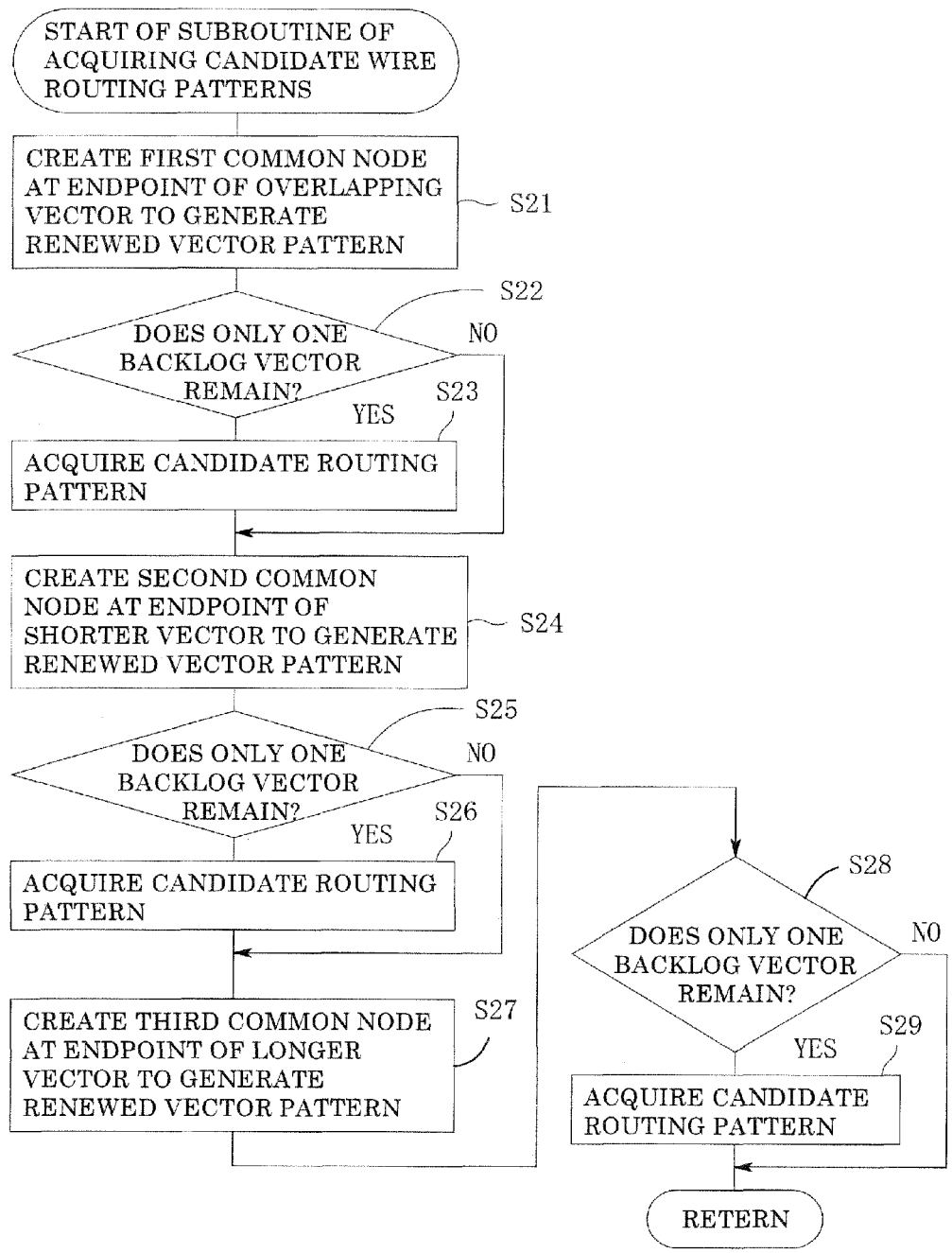
FIG. 12 is a flowchart of a subroutine for acquiring candidate routing patterns, the subroutine appearing in the flowchart shown in FIG. 11.
Figure 13:
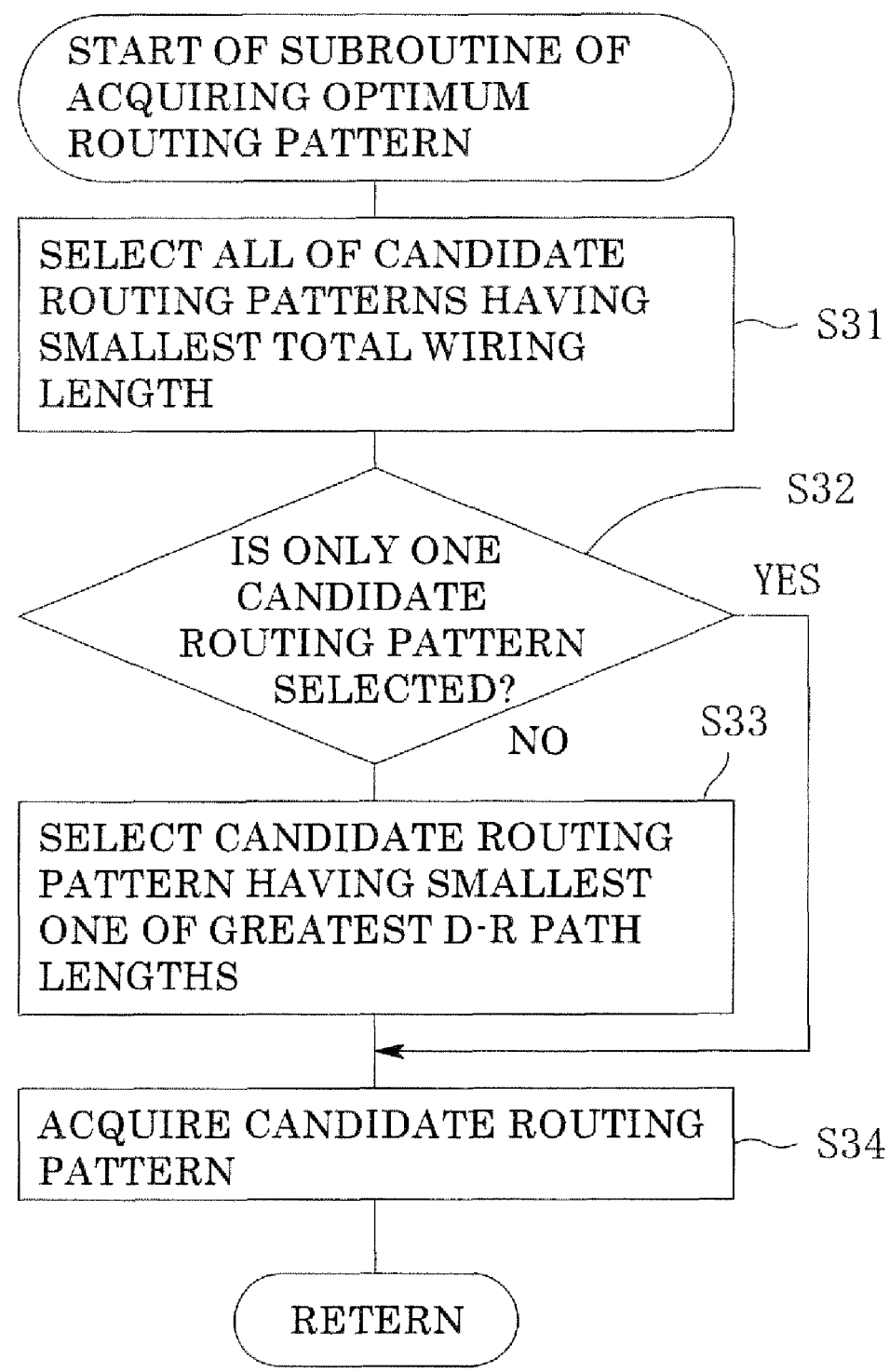
FIG. 13 is a flowchart of a subroutine for acquiring the optimum routing pattern, the subroutine appearing in the flowchart shown in FIG. 11.

The functions of the program mentioned above will now be reviewed with reference to some flowcharts shown in FIGS. 11 to 13. Referring to FIG. 11, the programmed computer acquires the coordinate values of a driver and receivers: see step S11. This function means that an operator inputs the first arrangement of the terminals shown in FIG. 5 for example to a programmed computer and the computer acquires the coordinate values of the terminal arrangement.

Next, the computer creates a vector pattern, which includes vectors headed from the driver to the respective receivers: see step S12. This function corresponds to the generation of the initial vector pattern shown in FIG. 5. The initial vector pattern includes plural vectors, all of which are treated as backlog vectors.

Next, the computer calculates, for the vector pattern that includes plural backlog vectors, the overlapping length for each of the possible vector pairs each of which consists of any two backlog vectors: see step 13. The overlapping length is defined as the sum of the overlapping value of X-coordinates and the overlapping value of Y-coordinates for the two vectors belonging to the relevant vector pair. The computer compares the overlapping lengths with one another among the possible vector pairs, and selects one vector pair that has the greatest overlapping length: see step S14. The computer determines the overlapping vector for the selected vector pair. The overlapping vector is defined as a vector that has an origin located on the driver and an endpoint having an X-coordinate that is consistent with the overlapping value of the X-coordinates and a Y-coordinate that is consistent with the overlapping value of the Y-coordinates. Explaining with reference to the initial vector pattern shown in FIG. 5 for example, the selected vector pair is a combination of the vector D→R2 and the vector D→R3, the endpoint of the overlapping vector is located on the coordinate (8,0), and the overlapping length is eight.

After selection of the vector pair, the computer executes a subroutine of acquiring candidate routing patterns: see step S15. A flowchart of the subroutine is shown in FIG. 12.

Referring to FIG. 12, the computer creates, for the specified selected vector pair, the first common node that is located on the endpoint of the overlapping vector to generate a renewed vector pattern: see step S21. The renewed vector pattern corresponds to the pattern of condition 1-1 shown in FIG. 6. In the renewed vector pattern, the computer creates two vectors that have a common origin located on the first common node and respective endpoints located on the receivers belonging to the selected vector pair: the two vectors are defined as route-defined vectors. The computer deletes the two backlog vectors from which the route-defined vectors originate, and generates a new backlog vector that is consistent with the overlapping vector. Explaining with reference to condition 1 shown in FIG. 6 for example, the current two backlog vectors D→R2 and D→R3 are deleted and a new backlog vector that is consistent with the overlapping vector is created. With these operations, the number of the backlog vectors decreases by one, and thus the routing commonality advances. The computer determines the number of the backlog vectors that exist in the renewed vector pattern: see step S22. If only one backlog vector remains, the computer acquires the current vector pattern as a candidate routing pattern (see step S23), and thereafter goes to the subsequent operations regarding the second common node. If plural backlog vectors remain, the computer acquires no candidate routing pattern and goes to the subsequent operations regarding the second common node. Explaining with reference to condition 1 shown in FIG. 6 for example, the two backlog vectors remain, and thus the computer acquires no candidate routing pattern and goes to the subsequent operations regarding the second common node.

Next, the computer executes the operations regarding the second common node: see step S24. The operations correspond to condition 2 shown in FIG. 6. The computer creates the second common node, which is located on the endpoint of the shorter vector of the two vectors belonging to the selected vector pair. The computer creates one vector that has an origin located on the second common node and an endpoint located on the endpoint of the longer vector of the two vectors belonging to the selected vector pair. The one vector is defined as a route-defined vector. The computer deletes the backlog vector that is consistent with the longer vector, and leaves the backlog vector that is consistent with the shorter vector to generate another renewed vector pattern. Explaining with reference to condition 2 shown in FIG. 6 for example, the vector R2→R3 is defined as the route-defined vector, the backlog vector D→R3 that is consistent with the longer vector is deleted, and the backlog vector D→R2 that is consistent with the shorter vector remains. The computer determines, also in the operations for the second common node as for the first common node, the number of the backlog vectors that exist in the renewed vector pattern: see step S25. If only one backlog vector remains, the computer acquires the current vector pattern as a candidate routing pattern (see step S26), and thereafter goes to the subsequent operations regarding the third common node. If plural backlog vectors remain, the computer acquires no candidate routing pattern and goes to the subsequent operations regarding the third common node. Explaining with reference to condition 2 shown in FIG. 6 for example, the two backlog vectors remain, and thus the computer acquires no candidate routing pattern and goes to the subsequent operations regarding the third common node.

Next, the computer executes the operations regarding the third common node: see step S27. The operations correspond to condition 3 shown in FIG. 6. The computer creates the third common node, which is located on the endpoint of the longer vector of the two vectors belonging to the selected vector pair. The computer creates one vector that has an origin located on the third common node and an endpoint located on the endpoint of the shorter vector of the two vectors belonging to the selected vector pair. The one vector is defined as a route-defined vector. The computer deletes the backlog vector that is consistent with the shorter vector, and leaves the backlog vector that is consistent with the longer vector to generate further another renewed vector pattern. Explaining with reference to condition 3 shown in FIG. 6 for example, the vector R3→R2 is defined as the route-defined vector, the backlog vector D→R2 that is consistent with the shorter vector is deleted, and the backlog vector D→R3 that is consistent with the longer vector remains. The computer determines, also in the operations for the third common node as for the first and second common nodes, the number of the backlog vectors that exist in the renewed vector pattern: see step S28. If only one backlog vector remains, the computer acquires the current vector pattern as a candidate routing pattern (see step S29), and thereafter completes the subroutine and returns to the flowchart shown in FIG. 11. If plural backlog vectors remain, the computer acquires no candidate routing pattern and completes the subroutine and returns to the flowchart shown in FIG. 11. Explaining with reference to condition 3 shown in FIG. 6 for example, the two backlog vectors remain, and thus the computer quires no candidate routing pattern and returns to the flowchart shown in FIG. 11.

When completing the subroutine, shown in FIG. 12, of acquiring candidate routing patterns, three renewed vector patters are generated from one vector pattern. If only one backlog vector remains in the renewed vector pattern, the computer acquires the current vector pattern as a candidate routing pattern. If plural backlog vectors still remain, the computer returns to the flowchart shown in FIG. 11, and selects, for the renewed vector pattern, one vector pair having the greatest overlapping length, and repeats the subroutine of acquiring candidate routing patterns. If there are three receivers in the arrangement of terminals, the subroutine must be repeated twice until the number of the backlog vectors decreases to only one. Therefore, the number of the candidate routing patterns that should be acquired is in principle nine, which is obtained by the calculation of three times three. The nine patterns correspond to the nine candidate routing patterns for conditions 1-1 to 3-3 shown in FIGS. 7 to 9.

Completing the subroutine of acquiring candidate routing pattern, the computer returns to the flowchart shown in FIG. 11, and makes a decision about the backlog pattern: see step S16. Namely, the computer determines whether or not any backlog pattern remains, noting that the backlog pattern is defined as a pattern that includes plural backlog vectors and thus is not in the state from which the computer can acquire a candidate routing pattern. If any backlog pattern remains, the computer selects any one backlog pattern (see step S17) and returns to the step of calculating the overlapping length of each vector pair. If no backlog pattern remains, it means the completion of acquisition of the candidate routing patterns and thus the computer goes to a subroutine of acquiring the optimum routing pattern: see step S18.

Figure 10:
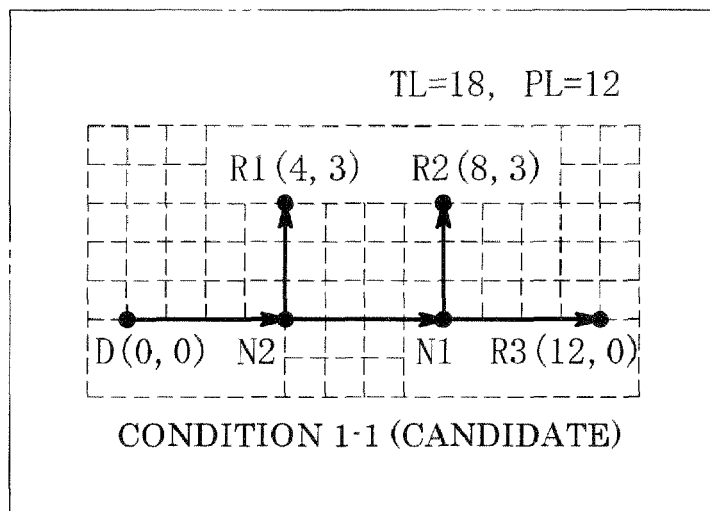
FIG. 10 shows vector patterns of conditions 1-1 and 2-1 in comparison with each other.
Figure 10:
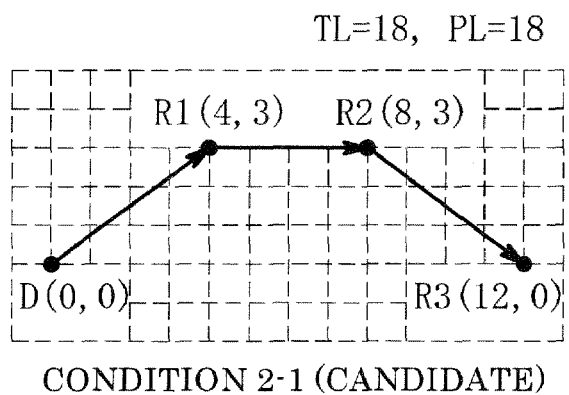

Referring to FIG. 13, there is shown the subroutine of acquiring the optimum routing pattern. The computer calculates the total wiring lengths for the plural candidate routing patterns that have been acquired, and selects one or more candidate routing patterns that have the same smallest total wiring length: see step S31. This operation corresponds to the selection of one or more candidate routing patterns that have the smallest total wiring length TL among the nine candidate routing patterns shown in FIGS. 7 to 9. If only one candidate routing pattern is selected (see step S32), the computer acquires the selected wire routing pattern as the optimum routing pattern. If plural candidate routing patterns are selected, the computer further compares the greatest D-R path lengths with one another among the selected wire routing patterns: see step S33. Then, the computer acquires the candidate routing pattern that has the smallest one of the greatest D-R path lengths as the optimum routing pattern: see step S34. In this embodiment, the computer finds out two routing patterns of conditions 1-1 and 2-1, as shown in FIG. 10, that have the same smallest total wiring length TL, and the computer selects the wire routing pattern of condition 2-1 that has the smallest one of the greatest D-R path lengths as the optimum routing pattern. Now the operations of the program have been completed.

Next, we will compare the optimum routing pattern that can be obtained by the program according to the present invention with other optimum routing patterns that can be obtained by the prior art. The wire routing pattern of condition 1-1 shown in FIG. 10 (this pattern has been obtained by the program of the present invention as the optimum routing pattern) may be obtained also by the maximized overlapping cost method that is disclosed in the third publication mentioned above. The condition 1-1 corresponds to the adoption of the first common node twice. These operations would correspond, in principle, to the concept in which wiring paths from the driver to the receivers should be converted to an improved pattern that has as much common path as possible to raise routing commonality. This concept would be substantially consistent with the maximized overlapping cost method mentioned above. Accordingly, it would be no wonder that the wire routing patter of condition 1-1 becomes the same as the pattern obtained by the maximized overlapping cost method.

On the other hand, the wire routing pattern of condition 2-1 shown in FIG. 10 (this pattern has not been obtained by the program of the present invention as the optimum routing pattern) is consistent with the pattern obtained by the approximate solution of the minimum Steiner tree that is disclosed in the first publication mentioned above. The approximate solution of the minimum Steiner tree is a method for generating a wire routing pattern that has the smallest total wiring length, and thus the method can generate the pattern having the smallest total wiring length like the pattern of condition 2-1. The approximate solution of the minimum Steiner tree, however, does not use the concept in which the lengths of wiring paths from the driver to the receivers must be smallest as possible, and therefore the solution cannot generate the pattern of condition 1-1.

Considering only the first arrangement of terminals shown in FIG. 5, the wire routing pattern obtained by the program of the invention is consistent with the pattern obtained by the maximized overlapping cost method. Further comparing the number of necessary processing steps, the program of the present invention requires acquisition of plural candidate routing patterns on the way to the optimum pattern (it can be said that if the number of receivers increases, the number of candidate routing patterns increases considerably), while the maximized overlapping cost method always requires, in principle, acquisition of one kind of candidate routing pattern. Accordingly, the maximized overlapping cost method is less in the number necessary processing steps than the program of the present invention and thus the method would be more advantageous than the present invention. However, when considering another arrangement of terminals as described later, the wire routing pattern obtained by the maximized overlapping cost method may disadvantageously have the total wiring length that is greater than that f the pattern obtained by the program of the present invention, because the maximized overlapping cost method does not use the concept in which the total wiring length must be smallest as possible.

Figure 14:
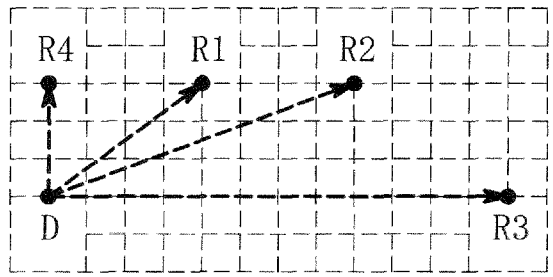
FIG. 14 shows the second arrangement of terminals and its resultant optimum routine patterns.
Figure 14:
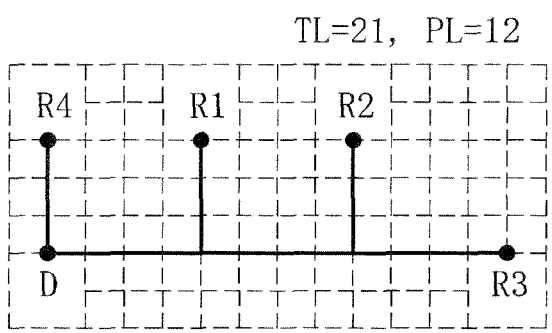
Figure 14:
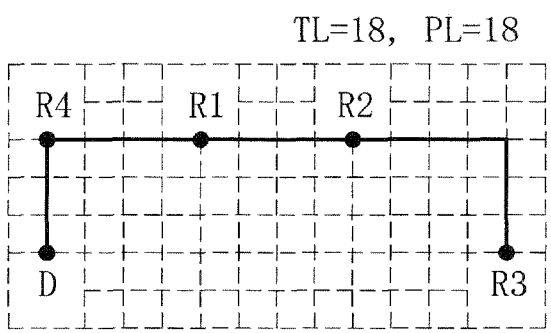

Referring to FIG. 14, there are shown the second arrangement of terminals and its resultant optimum routing pattern. The second arrangement includes another receiver R4 in addition to the first arrangement shown in FIG. 5. It is noted that the second arrangement is depicted together with four backlog vectors headed from the driver to the four receivers. When the maximized overlapping cost method is applied to the second arrangement, the resultant optimum routing pattern becomes the pattern shown at the middle site in FIG. 14. The total wiring length TL is twenty one, and the greatest D-R path length PL is twelve. On the other hand, when the approximate solution of the minimum Steiner tree is applied to the second arrangement, the resultant optimum routing pattern becomes the pattern shown at the lower site in FIG. 14. The total wiring length TL is eighteen, and the greatest D-R path length PL is eighteen. It should be reminded that the purpose of the program according to the present invention is to generate the wire routing pattern that has the smallest total wiring length, and if there exist plural patterns having the same smallest total wiring length, the purpose is to generate the wire routing pattern that has the smallest one of the greatest D-R path lengths among the patterns having the same smallest total wiring length. Accordingly, comparing the two resultant wire routing patterns with each other, the pattern at the lower site is more preferable than the pattern at the middle site because the former has a smaller total wiring length than that of the latter. And importantly, when the program of the present invention is applied to the second arrangement, the resultant optimum routing pattern becomes the pattern at the lower site in FIG. 14. That is to say, in the case of the second arrangement of terminals, the maximized overlapping cost method cannot generate the best wire routing pattern, while the approximate solution of the minimum Steiner tree can generate the best wire routing pattern, which is obtained also by the program of the present invention.

After all, considering various types of arrangements of terminals, the maximized overlapping cost method is inferior because it cannot generate the best wire routing pattern for the second arrangement of terminals, and the approximate solution of the minimum Steiner tree is also inferior because it cannot generate the best wire routine pattern for the first arrangement of terminals. It is noted that the best wire routing pattern, which the program of the present invention aims, is a pattern that has the smallest total wiring length, and if there exist plural patterns having the same smallest total wiring length, the best wire routing pattern is a pattern that has the smallest one of the greatest D-R path lengths among the plural patterns having the same smallest total wiring length. The program of the present invention can achieve the aim mentioned above for whatever the arrangement of terminals as long as the inventors know.

Incidentally, the best wire routing pattern can be obtained with adoption of only the first and second common nodes for various arrangements of terminals: it is noted that the first common node is located on the endpoint of the overlapping vector of the selected vector pair, and the second common node is located on the endpoint of the shorter vector of the selected vector pair. The inventors, however, have considered various cases and have found out that the program of the present invention not always generates the pattern having the smallest total wiring length under the condition of adopting only the first and second common nodes. Then, the program of the present invention adopts further the third common node in acquiring candidate routing patterns. It is noted that the third common node is located on the endpoint of the vector of the selected vector pair.

Figure 15:
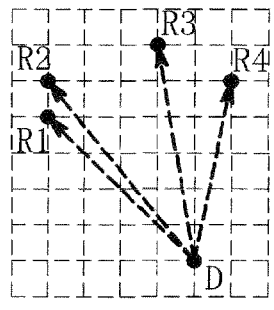
FIG. 15 shows the third arrangement of terminals and its resultant optimum routing patterns, the third arrangement being presented for explaining the advantage when the third common node is considered.
Figure 15:
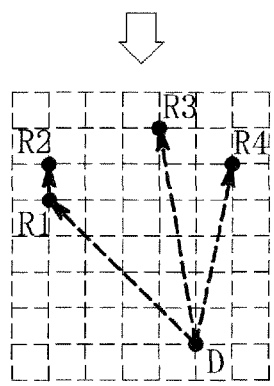
Figure 15:
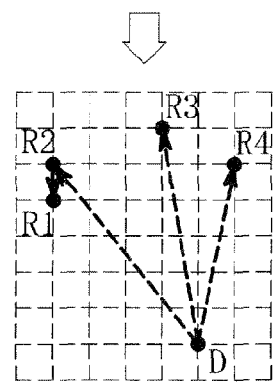
Figure 15:
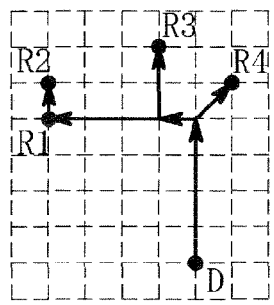
Figure 15:
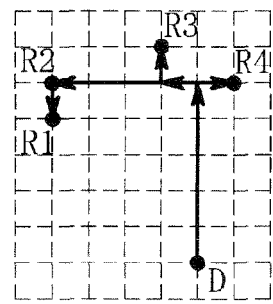

Referring to FIG. 15, there is shown an illustration that indicates an advantage of adopting the third common node, the illustration showing the third arrangement and its resultant optimum routing patterns. The third arrangement includes one driver D and four receivers R1 to R4. In the case of no adopting the third common node, i.e., when the candidate routing patterns ate acquired with the use of the first and second common nodes, the resultant optimum routing pattern becomes a pattern shown at the lower left side in FIG. 15. The total wiring length TL is thirteen, and the greatest D-R path length PL is nine. On the other hand, in the case of adopting further the third common node, the resultant optimum routing pattern becomes a pattern shown at the lower right side in FIG. 15. The total wiring length TL is twelve, and the greatest D-R path length PL is ten. It is seen that the optimum routing pattern with adoption of the third common node is more preferable for the present invention than the optimum routing pattern with no adoption of the third common node, because the best wire routing pattern, which the program of the present invention aims, is a pattern that has the smallest total wiring length, and if there exist plural patterns having the same smallest total wiring length, the best wire routing pattern is a pattern that has the smallest one of the greatest D-R path lengths among the plural patterns having the e smallest total wiring length.

Figure 16:
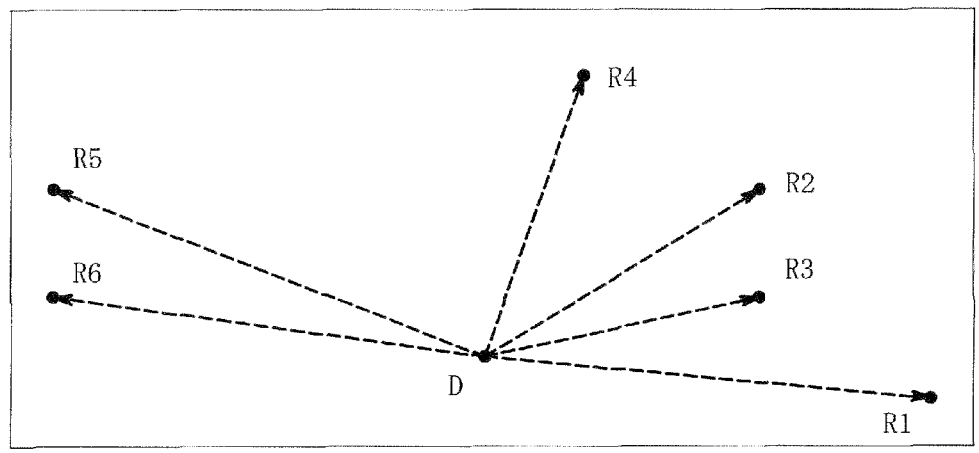
FIG. 16 shows the fourth arrangement of terminals and its resultant optimum routing pattern.
Figure 16:
Figure 16:
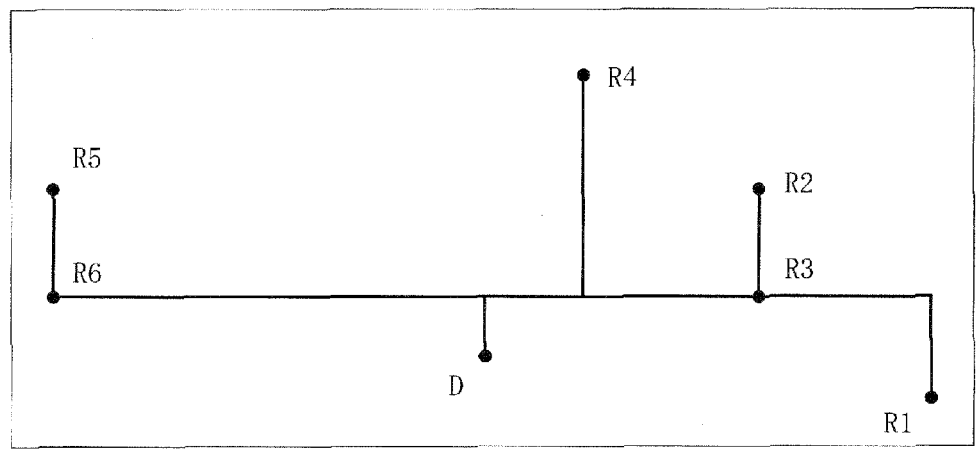

Referring to FIG. 16, there are shown the fourth arrangement of terminals and its resultant optimum routing pattern. The fourth arrangement is created in consideration of an arrangement of terminals in the real wiring board. The fourth arrangement includes one driver and six receivers R1 to R6. When the program of the present invention is applied to the fourth arrangement, the resultant optimum routing pattern becomes a pattern shown in the lower site in FIG. 16.

What is claimed:

1. A non-transitory computer readable recording medium having recorded thereon a program for generating a wire routing pattern that includes wiring paths between one signal-source terminal and a plurality of signal-receiving terminals, the program being executable by a computer to perform functions comprising:

(a) a terminal-coordinate-acquiring function or a first function, in which the first function acquires a coordinate of the signal-source terminal and respective coordinates of the signal-receiving terminals, the coordinates being defined in a two-dimensional orthogonal coordinate system that is specified by X-axis and Y-axis intersecting with each other at right angles;

(b) a vector-pattern-generating function or a second function, in which the second function generates an initial vector pattern including: a parent node that is located on the signal-source terminal; a plurality of child nodes that are located on the signal-receiving terminals; and a plurality of vectors that have a common origin located on the parent node and respective endpoints located on the respective child nodes, the plurality of the vectors being defined as backlog vectors;

(c) an overlapping-vector-generating function or a third function, in which the third function generates all kinds of possible vector pairs each of which is made of any two of the backlog vectors, and the third function calculates a sum of an overlapping value of X-coordinates and an overlapping value of Y-coordinates for two vectors belonging to each of the possible vector pairs, and the third function selects one vector pair having a greatest sum of the two overlapping values among the sums of the two overlapping values for the possible vector pairs, and the third function generates a vector having an origin located on the signal-source terminal and an endpoint having coordinate consisting of an X-coordinate that is consistent with the overlapping value of the X-coordinates and a Y-coordinate that is consistent with the overlapping value of the Y-coordinates for the selected vector pair, the generated vector being defined as an overlapping vector;

(d) a first common node-generating function or a fourth function, in which the fourth function generates a first common node which is located on the endpoint of the overlapping vector of the selected vector pair, the fourth function generates two vectors having a common origin located on the first common node and respective endpoints located on the two signal-receiving terminals belonging to the selected vector pair, the generated two vectors being defined as route-defined vectors, and the fourth function deletes the two backlog vectors from which the route-defined vectors originate, and the fourth function generates a new backlog vector that is consistent with the overlapping vector to generate a renewed vector pattern;

(e) a second common node-generating function or a fifth function, in which the fifth function generates a second common node which is located on an endpoint of a shorter vector of the two vectors belonging to the selected vector pair, and the fifth function generates one vector having an origin located on the second common node and an endpoint located on an endpoint of a longer vector of the two vectors belonging to the selected vector pair, the generated one vector being defined as a route-defined vector, and the fifth function deletes the backlog vector that is consistent with the longer vector, and the fifth function leaves the backlog vector that is consistent with the shorter vector to generate another renewed vector pattern;

(f) a third common node-generating function or a sixth function, in which the sixth function generates a third common node which is located on the endpoint of the longer vector, and the sixth function generates one vector having an origin located on the third common node and an endpoint located on the endpoint of the shorter vector, the generated one vector being defined as a route-defined vector, and the sixth function deletes the backlog vector that is consistent with the shorter vector, and the sixth function leaves the backlog vector that is consistent with the longer vector to generate further another renewed vector pattern;

(g) a candidate-routing-pattern-acquiring function or a seventh function, in which the seventh function determines whether or not only one backlog vector remains every after execution of the fourth, fifth and sixth functions, and if only one backlog vector remains the seventh function acquires a current vector pattern as a candidate routing pattern, and if plural backlog vectors remain the seventh function acquires a current vector pattern as a new backlog pattern;

(h) a backlog-pattern-remainder-determining function or a eighth function, in which the eighth function determines whether or not at least one backlog pattern remains, and if at least one backlog pattern remains the eighth function selects any one backlog pattern and repeats, for the selected backlog pattern, execution of the third to the seventh functions, and if no backlog pattern remains the eighth function confirms completion of acquisition of the candidate routing patterns;

(i) a total-length calculation-function or a ninth function, in which the ninth function calculates each total length of the vectors belonging to each of the candidate routing patterns that have been acquired, the total length being defined as a total wiring length; and (j) an optimum-routing-pattern-acquiring function or a tenth function, in which if there is only one candidate routing pattern having a smallest total wiring length among the calculated total wiring lengths the tenth function acquires the candidate routing pattern having the smallest total wiring length as an optimum routing pattern, and if there are plural candidate routing patterns having the same smallest total wiring length the tenth function calculates each length of a wiring path between the signal-source terminal and each of the signal-receiving terminals for each of the candidate routing patterns having the same smallest total wiring length, the calculated length of the wiring path being defined as a D-R path length, and the tenth function compares a greatest one of the D-R path lengths of one candidate routing pattern having the same smallest total wiring length with another greatest one of the D-R path lengths of another candidate routing pattern having the same smallest total wiring length to determine a smallest one of the greatest D-R path lengths, and the tenth function acquires the candidate routing pattern having the smallest one of the greatest D-R path lengths as an optimum routing pattern.

2. A method for generating a wire routing pattern that includes wiring paths between one signal-source terminal and a plurality of signal-receiving terminals, wherein the method is performed by a computer provided with a non-transitory computer readable recording medium having a program recorded thereon which is executable by the computer to perform the method, and wherein the method comprises:

(a) a terminal-coordinate-acquiring step or a first step, in which the first step acquires a coordinate of the signal-source terminal and respective coordinates of the signal-receiving terminals, the coordinates being defined in a two-dimensional orthogonal coordinate system that is specified by X-axis and Y-axis intersecting with each other at right angles;

(b) a vector-pattern-generating step or a second step, in which the second step generates an initial vector pattern including: a parent node that is located on the signal-source terminal; a plurality of child nodes that are located on the signal-receiving terminals; and a plurality of vectors that have a common origin located on the parent node and respective endpoints located on the respective child nodes, the plurality of the vectors being defined as backlog vectors;

(c) an overlapping-vector-generating step or a third step, in which the third step generates all kinds or possible vector pairs each of which is made of any two of the backlog vectors, and the third step calculates a sum of an overlapping value of X-coordinates and an overlapping value of Y-coordinates for two vectors belonging to each of the possible vector pairs, and the third step selects one vector pair having a greatest sum of the two overlapping values among the sums of the two overlapping values for the possible vector pairs, and the third step generates a vector having an origin located on the signal-source terminal and an endpoint having a coordinate consisting of an X-coordinate that is consistent with the overlapping value of the X-coordinates and a Y-coordinate that is consistent with the overlapping value of the Y-coordinates for the selected vector pair, the generated vector being defined as an overlapping vector;

(d) a first common node-generating step or a fourth step, in which the fourth step generates a first common node which is located on the endpoint of the overlapping vector of the selected vector pair, the fourth step generates two vectors having a common origin located on the first common node and respective endpoints located on the two signal-receiving terminals belonging to the selected vector pair, the generated two vectors being defined as route-defined vectors, and the fourth step deletes the two backlog vectors from which the route-defined vectors originate, and the fourth step generates a new backlog vector that is consistent with the overlapping vector to generate a renewed vector pattern;

(e) a second common node-generating step or a fifth step, in which the fifth step generates a second common node which is located on an endpoint of a shorter vector of the two vectors belonging to the selected vector pair, and the fifth step generates one vector having an origin located on the second common node and an endpoint located on an endpoint of a longer vector of the two vectors belonging to the selected vector pair, the generated one vector being defined as a route-defined vector, and the fifth step deletes the backlog vector that is consistent with the longer vector, and the fifth step leaves the backlog vector that is consistent with the shorter vector to generate another renewed vector pattern;

(f) a third common node-generating step or a sixth step, in which the sixth step generates a third common node which is located on the endpoint of the longer vector, and the sixth step generates one vector having an origin located on the third common node and an endpoint located on the endpoint of the shorter vector, the generated one vector being defined as a route-defined vector, and the sixth step deletes the backlog vector that is consistent with the shorter vector, and the sixth step leaves the backlog vector that is consistent with the longer vector to generate further another renewed vector pattern;

(g) a candidate-routing-pattern-acquiring step or a seventh step, in which the seventh step determines whether or not only one backlog vector remains every after execution of the fourth, fifth and sixth steps, and if only one backlog vector remains the seventh step acquires a current vector pattern as a candidate routing pattern, and if plural backlog vectors remain the seventh step quires a current vector pattern as a new backlog pattern;

(h) a backlog-pattern-remainder-determining step or a eighth step, in which the eighth step determines whether or not at least one backlog pattern remains, and if at least one backlog pattern remains the eighth step selects any one backlog pattern and repeats, for the selected backlog pattern, execution of the third to the seventh steps, and if no backlog pattern remains the eighth step confirms completion of acquisition of the candidate routing patterns;

(i) a total-length-calculation-step or a ninth step, in which the ninth step calculates each total length of the vectors belonging to each of the candidate routing patterns that have been acquired, the total length being defined as a total wiring length; and (j) an optimum-routing-pattern-acquiring step or a tenth step, in which if there is only one candidate routing pattern having a smallest total wiring length among the calculated total wiring lengths the tenth step acquires the candidate routing pattern having the smallest total wiring length as an optimum routing pattern, and if there are plural candidate routing patterns having the same smallest total wiring length the tenth step calculates each length of a wiring path between the signal-source terminal and each of the signal-receiving terminals for each of the candidate routing patterns having the same smallest total wiring length, the calculated length of the wiring path being defined as a D-R path length, and the tenth step compares a greatest one of the D-R path lengths of one candidate routing pattern having the same smallest total wiring length with another greatest one of the D-R path lengths of another candidate routing pattern having the same smallest total wiring length to determine a smallest one of the greatest D-R path lengths, and the tenth step acquires the candidate routing pattern having the smallest one of the greatest D-R path lengths as an optimum routing pattern.

* * * * *

UNITED STATES PATENT AND TRADEMARK OFFICE
CERTIFICATE OF CORRECTION

PATENT NO. : 8,365,130 B2
APPLICATION NO. : 13/338875
DATED : January 29, 2013
INVENTOR(S) : Katsushi Mikuni et al.

It is certified that error appears in the above-identified patent and that said Letters Patent is hereby corrected as shown below:

On the Title page;
    Item (57) Abstract, line 14-15:
    replace "greatest." with --greatest--.

In the Claims;
Column 21, Line 55; Claim 2 (c), Line 2:
    delete "or" and insert --of--.
Column 22, Line 48; Claim 2 (g), Line 7:
    delete "quires" and insert --acquires--.

Signed and Sealed this
Fourteenth Day of May, 2013

Teresa Stanek Rea
*Acting Director of the United States Patent and Trademark Office*